US008420546B2

(12) United States Patent
Uehara et al.

(10) Patent No.: US 8,420,546 B2
(45) Date of Patent: Apr. 16, 2013

(54) MANUFACTURING METHOD OF SEMICONDUCTOR DEVICE

(75) Inventors: Ichiro Uehara, Kanagawa (JP); Hideomi Suzawa, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 701 days.

(21) Appl. No.: 11/516,273

(22) Filed: Sep. 6, 2006

(65) Prior Publication Data

US 2007/0155182 A1    Jul. 5, 2007

Related U.S. Application Data

(63) Continuation of application No. 10/852,355, filed on May 24, 2004, now Pat. No. 7,119,022, which is a continuation of application No. 10/208,419, filed on Jul. 30, 2002, now Pat. No. 6,746,965.

(30) Foreign Application Priority Data

Aug. 1, 2001   (JP) ................................. 2001-234285

(51) Int. Cl.
*H01L 21/302* (2006.01)
*H01L 21/461* (2006.01)

(52) U.S. Cl.
USPC .......................................... 438/713; 438/749

(58) Field of Classification Search .................. 438/151, 438/157, 149
See application file for complete search history.

(56) References Cited

U.S. PATENT DOCUMENTS

| 4,692,205 A | | 9/1987 | Sachdev et al. | |
| 4,801,518 A | * | 1/1989 | Yamashita et al. | 430/325 |
| 4,935,334 A | | 6/1990 | Boettiger et al. | |
| 5,063,655 A | * | 11/1991 | Lamey et al. | 438/21 |
| 5,111,240 A | | 5/1992 | Boettiger et al. | |
| 5,129,991 A | | 7/1992 | Gilton | |
| 5,174,857 A | * | 12/1992 | Sung | 216/48 |

(Continued)

FOREIGN PATENT DOCUMENTS

EP    0 338 110 A1    10/1989
JP    61-184828       8/1986

(Continued)

OTHER PUBLICATIONS

Hatano, M. et al, "A Novel Self-Aligned Gate-Overlapped LDD Poly-Si TFT with High Reliability and Performance," International Electron Devices Meeting, Washington DC, Dec. 7-10, 1997, IDEM 97, pp. 523-526, (1997).

*Primary Examiner* — Steven Loke
*Assistant Examiner* — David Goodwin
(74) *Attorney, Agent, or Firm* — Husch Blackwell LLP

(57) ABSTRACT

In the manufacturing method of a GOLD structured TFT having a gate electrode of double-layered structure, in which, compared to a second layer gate electrode, the first layer gate electrode is thinner in film thickness and longer in dimension of the channel direction, by controlling the density of the photo-absorbent contained in a positive type resist such as diazonaphthoquinone (DNQ)-novolac resin series, the taper angle of the side wall is controlled to a desired angle range so that the angle thereof becomes smaller. Owing to this, it is possible to control the retreat amount of the resist when carrying out dry etching and the dimension of $L_{ov}$, area to a desired dimensional range so that the dimension thereof becomes larger.

18 Claims, 15 Drawing Sheets

U.S. PATENT DOCUMENTS

| | | |
|---|---|---|
| 5,506,168 A | 4/1996 | Morita et al. |
| 6,057,081 A * | 5/2000 | Yunogami et al. ............ 430/313 |
| 6,207,247 B1 | 3/2001 | Morita |
| 6,259,138 B1 * | 7/2001 | Ohtani et al. ................. 257/351 |
| 6,285,433 B1 | 9/2001 | Kawasaki |
| 6,432,620 B1 | 8/2002 | Arao |
| 6,497,992 B1 | 12/2002 | Yunogami et al. |
| 6,534,789 B2 * | 3/2003 | Ishida ............................ 257/72 |
| 7,306,980 B2 | 12/2007 | Takehashi et al. |
| 2002/0070382 A1 * | 6/2002 | Yamazaki et al. .............. 257/72 |

FOREIGN PATENT DOCUMENTS

| | | |
|---|---|---|
| JP | 6-20937 | 1/1994 |
| JP | 7-58004 | 3/1995 |
| JP | 8-274336 | 10/1996 |
| JP | 2001-168346 | 6/2001 |

* cited by examiner

I : LIGHT INTENSITY AT A POINT d DISTANCE FROM RESIST SURFACE
$I_0$ : LIGHT INTENSITY OF INCIDENT LIGHT
$\alpha$ : ABSORBANCE DEGREE OF RESIST PER UNIT FILM THICKNESS
d : DISTANCE FROM RESIST SURFACE LIGHT INTENSITY AT UNDESIRABLY EXPOSED PORTION 104
$$I = I_0 \exp[-\alpha (d_1 + d_2)]$$

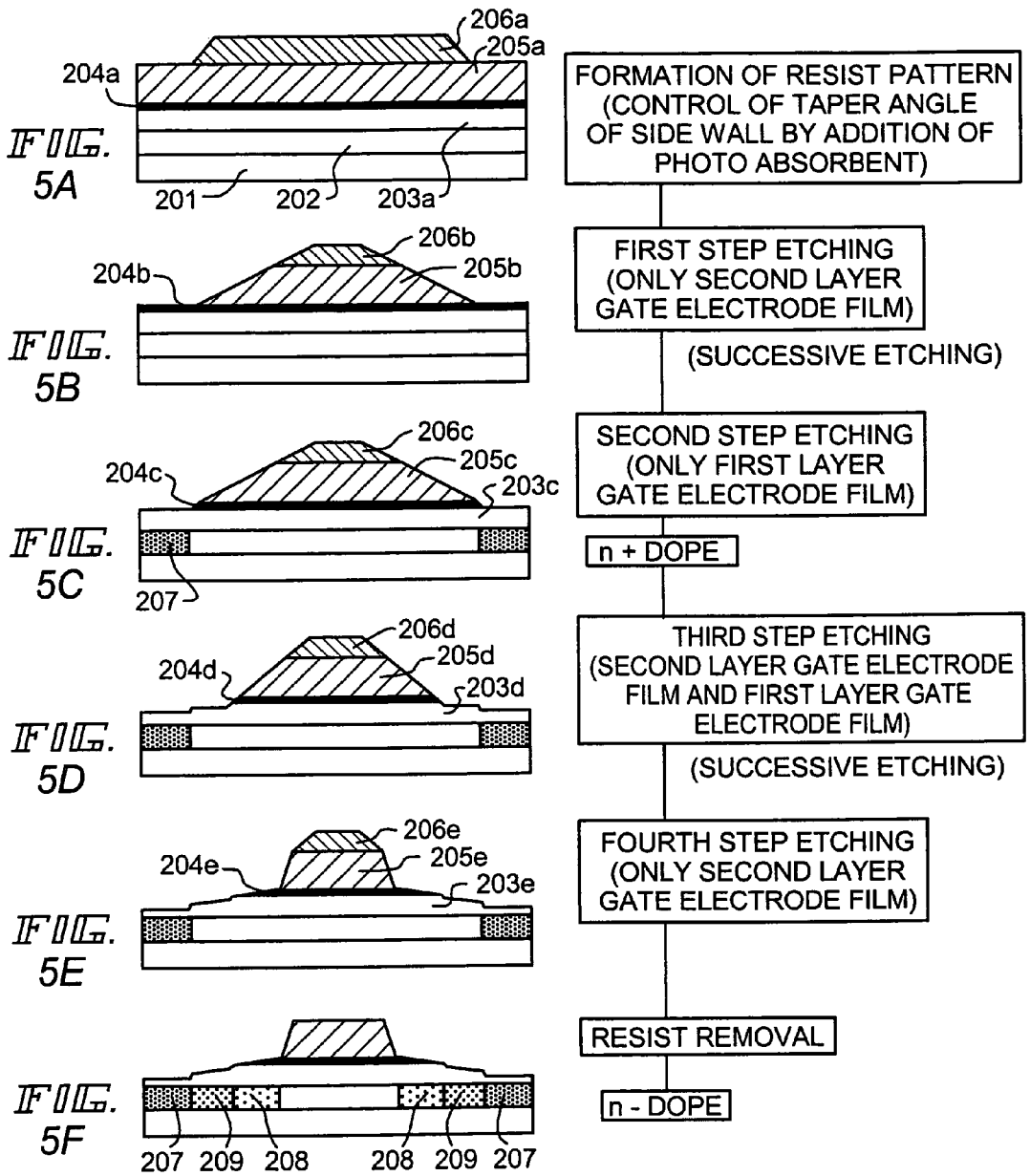

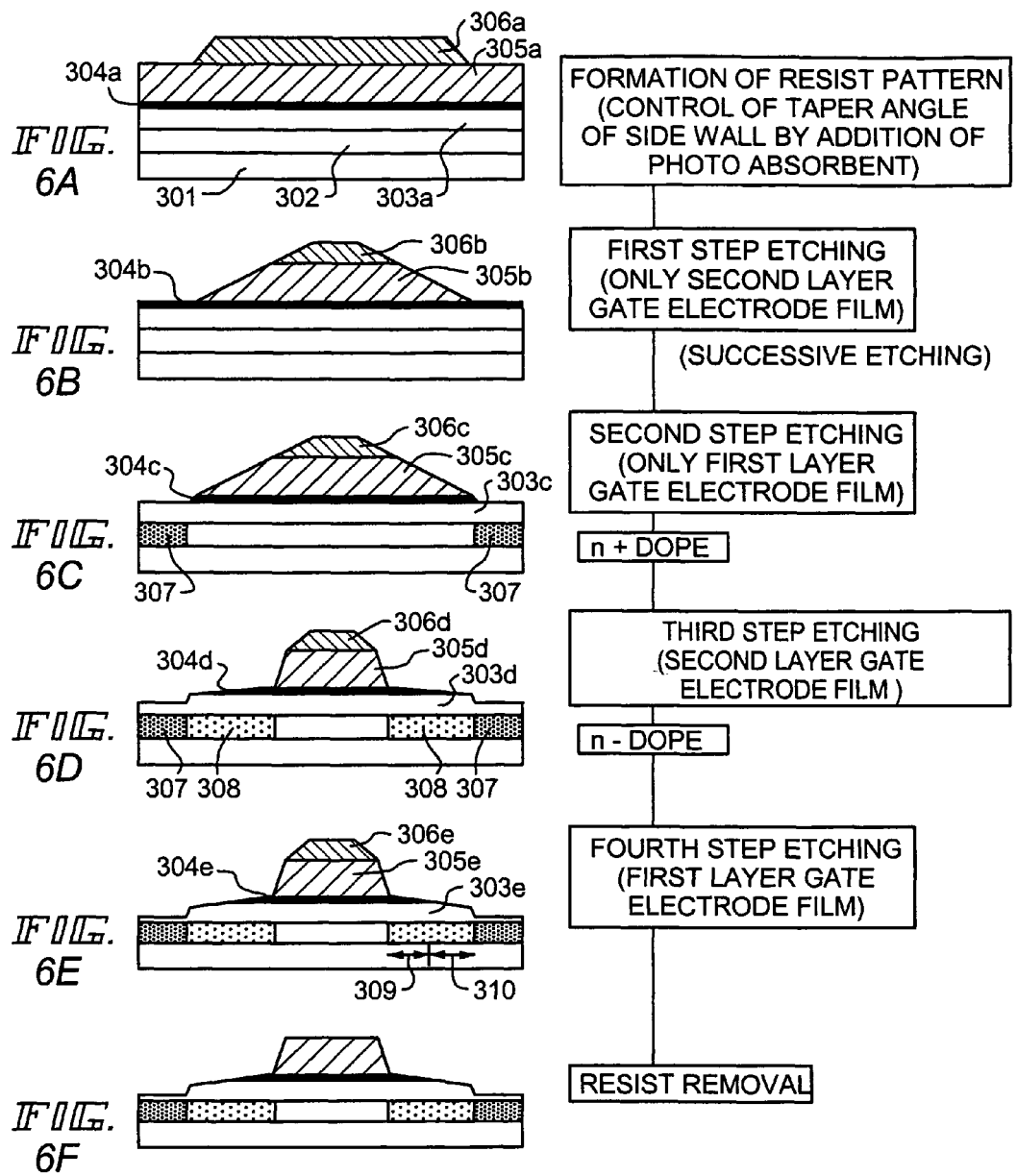

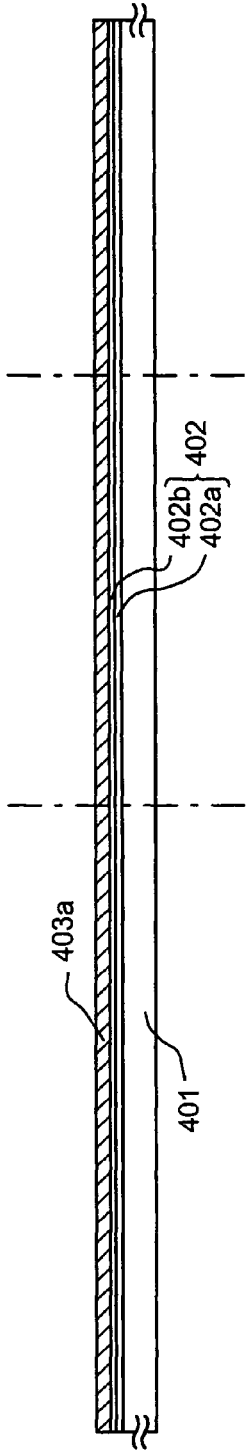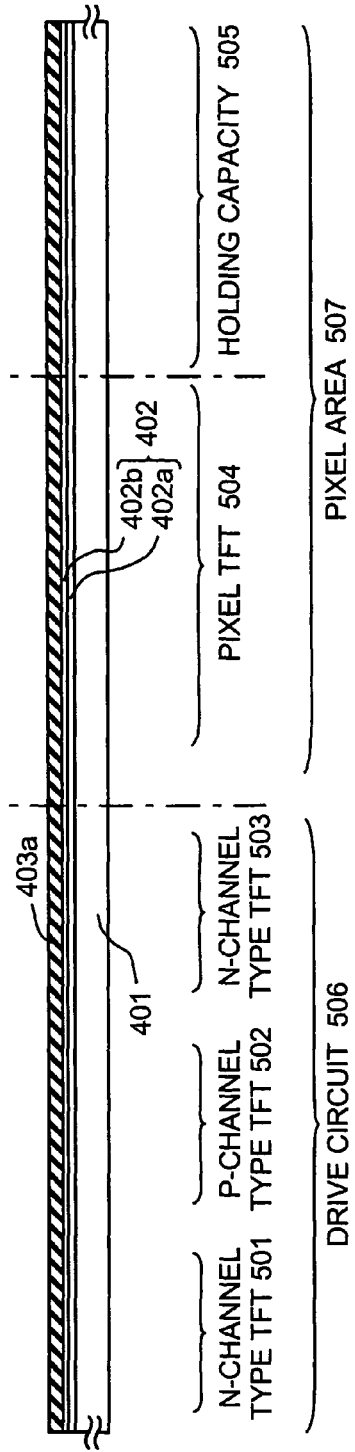

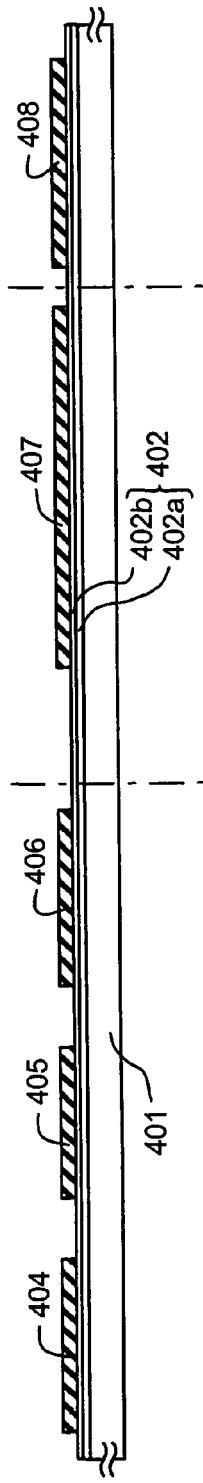
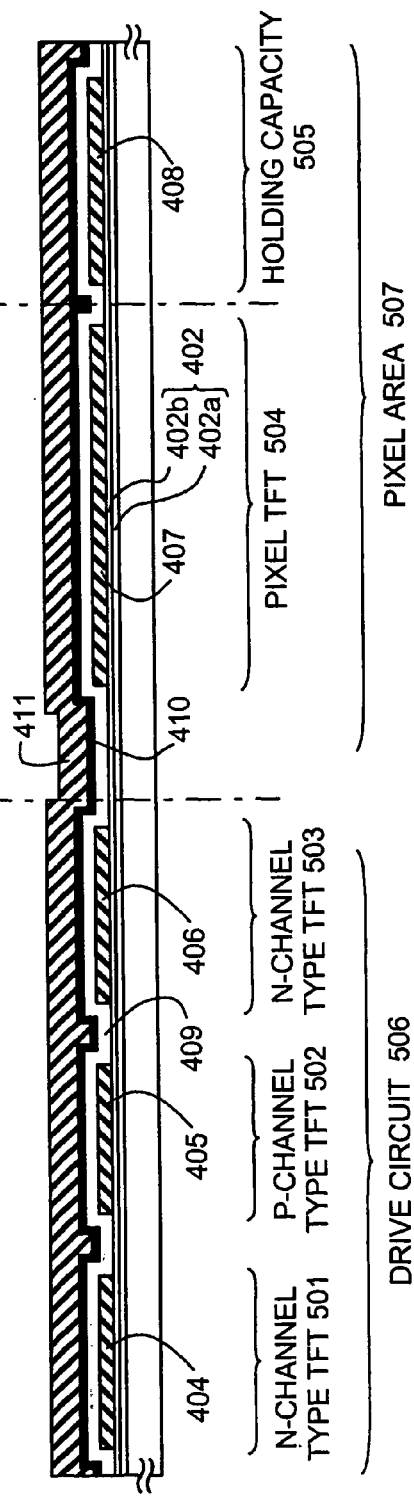

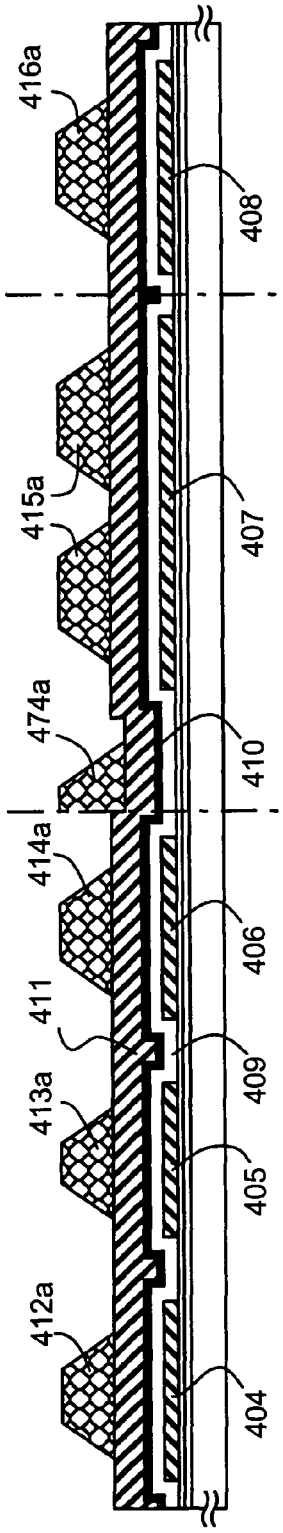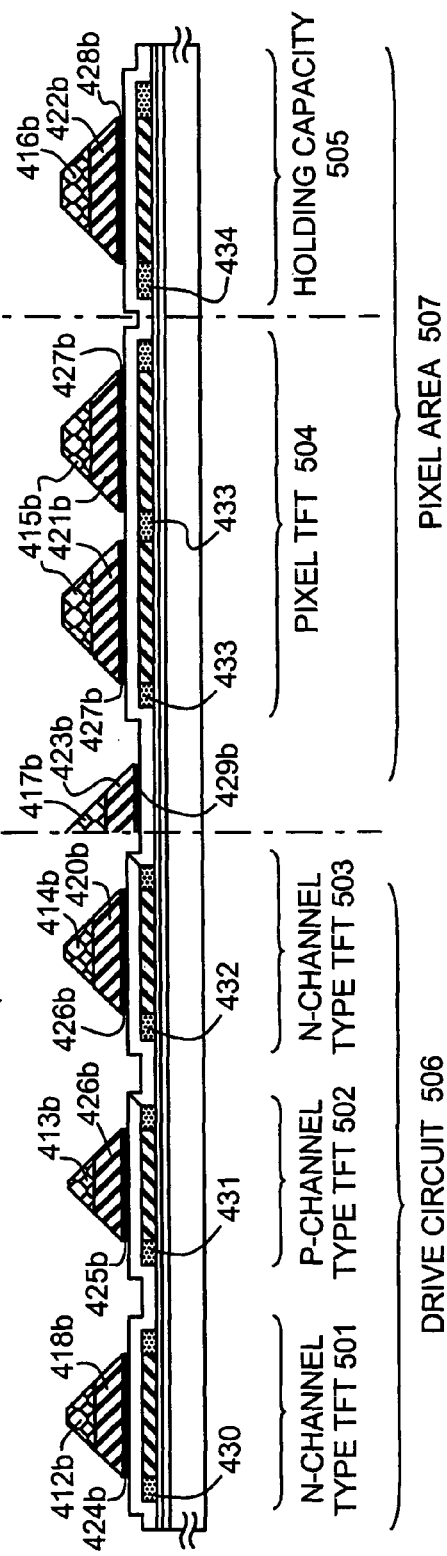

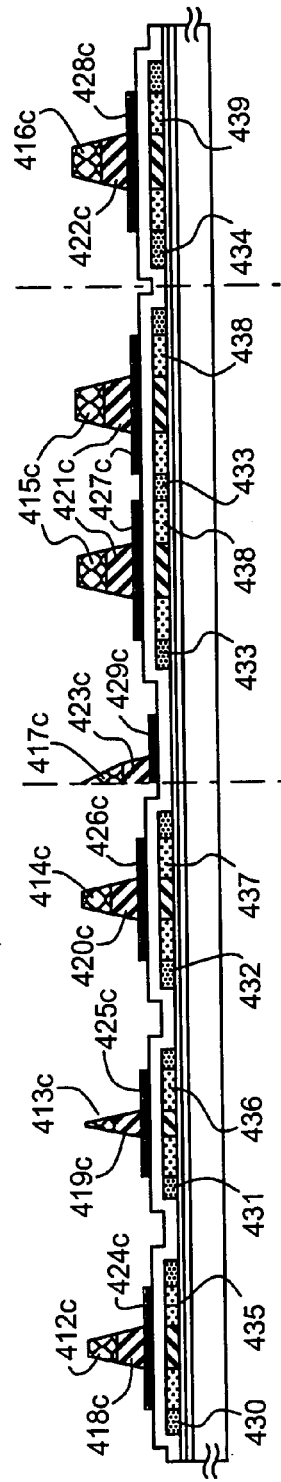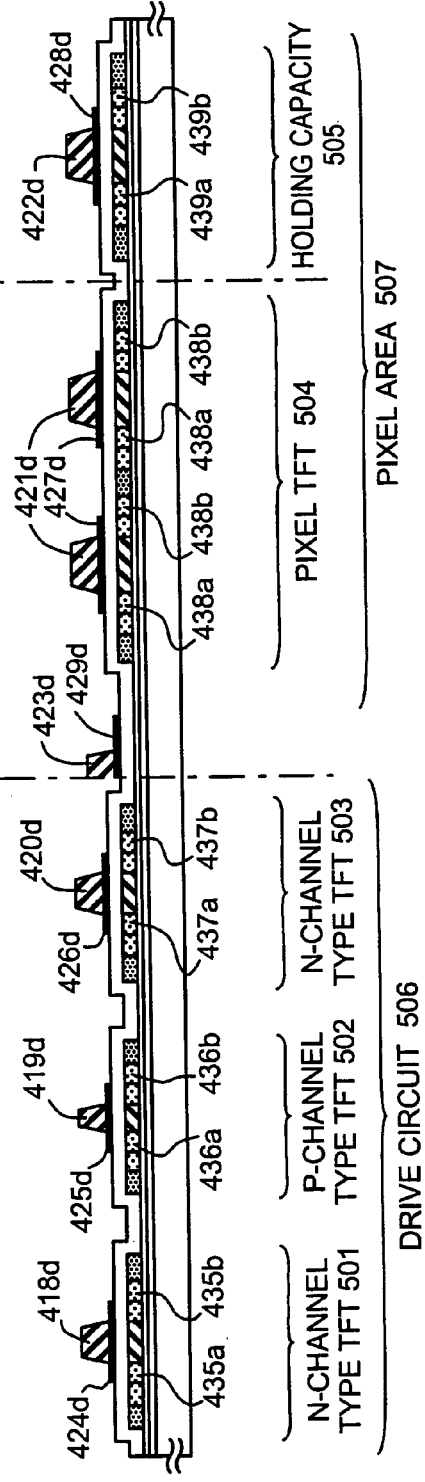

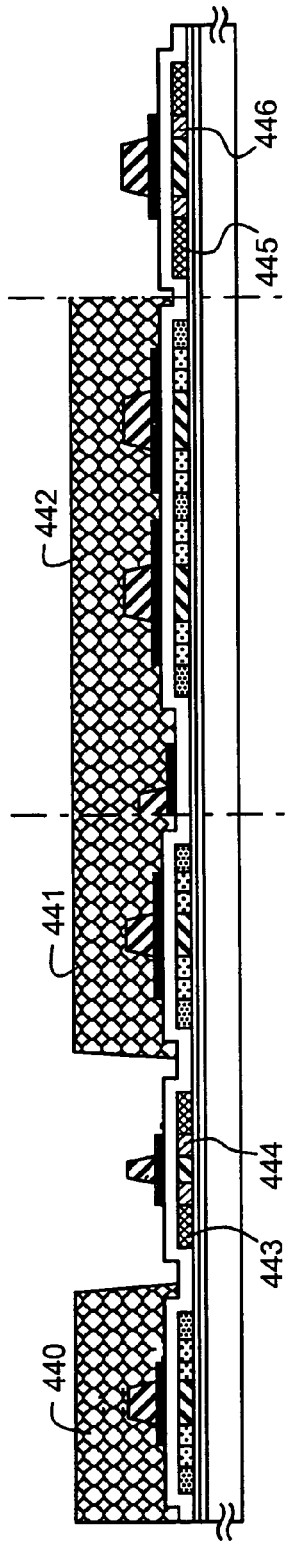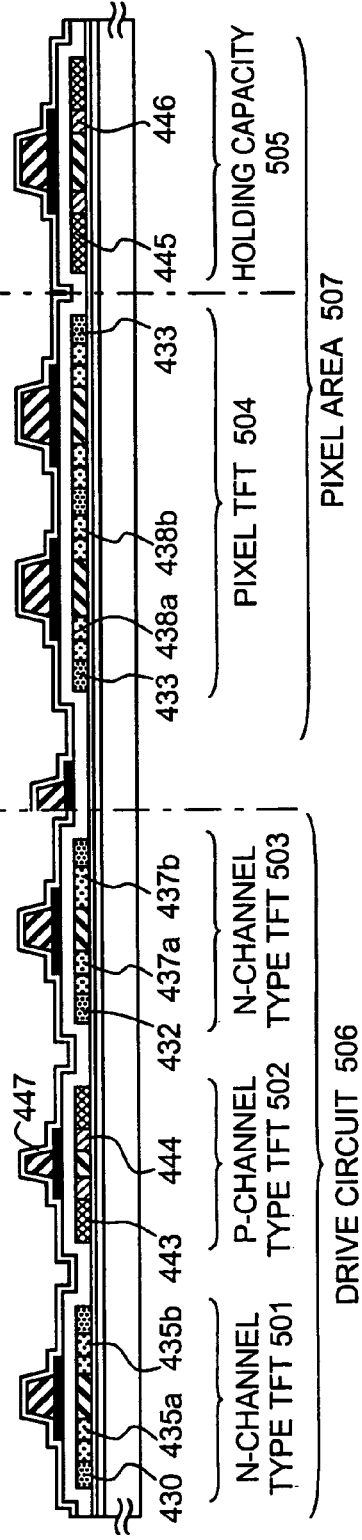

FORMATION OF SECOND INTERLAYER INSULATING FILM / FORMATION OF CONTACT HOLE

FORMATION OF METAL WIRING / FORMATION OF TRANSPARENT CONDUCTIVE FILM WIRING

LIGHT SOURCE OPTICAL SYSTEM AND DISPLAY DEVICE
(THREE-PLATE TYPE)

LIGHT SOURCE OPTICAL SYSTEM

LIGHT SOURCE OPTICAL SYSTEM AND DISPLAY DEVICE
(SINGLE PLATE TYPE)

LIGHT SOURCE OPTICAL SYSTEM AND DISPLAY DEVICE
(SINGLE PLATE TYPE)

LIGHT SOURCE OPTICAL SYSTEM AND DISPLAY DEVICE
(SINGLE PLATE TYPE)

MANUFACTURING METHOD OF SEMICONDUCTOR DEVICE

This application is a continuation of U.S. application Ser. No. 10/852,355, filed on May 24, 2004 now U.S. Pat. No. 7,119,022 which is a continuation of U.S. application Ser. No. 10/208,419 filed on Jul. 30, 2002 (now U.S. Pat. No. 6,746,965 issued Jun. 8, 2004).

BACKGROUND OF THE INVENTION

1. Field of the Invention

The present invention relates to a manufacturing method of a semiconductor device having a circuit composed of a thin film transistor (hereafter, referred to as TFT), and in particular to a manufacturing method of a semiconductor device having a gate electrode wiring of a forwardly tapered shape which is obtained by photolithography processing and dry etching processing.

2. Related Art

Recently, electrooptical devices such as active matrix type liquid crystal display device, which performs active matrix display using a TFT, have been drawing public attention. The electrooptical device, which performs active matrix display, is provided with a TFT switch to each electrooptical device and state of crystal orientation of TN (abbreviation of Twisted-Nematic) mode can be utilized. Compared to a passive matrix display, since the active matrix display has advantages in the points of response speed, angle of visibility and contrast, it has become a major trend in the current notebook-sized personal computers, liquid crystal TVs and the like.

Generally, in the TFT, amorphous silicon or polycrystalline silicon is used as the channel layer thereof. Particularly, the polycrystalline silicon TFT, which is manufactured by means of low-temperature processing (generally, lower than 600° C.), is in a trend of being reduced in price and being enlarged in size. Electron or positive hole of the polycrystalline silicon TFT has large electric field mobility. Accordingly, when the TFT is used in a liquid crystal display device, since it is possible to integrate not only the transistor for pixel but also the driver, which is a peripheral circuit thereof, each maker of liquid crystal display device has promoted its development. However, when the polycrystalline silicon TFT is driven for a long period of time, sometimes such problems concerning reliability that decrease of mobility or ON-current (current which flows when the TFT is ON), increase of OFF-current (current which flows when the TFT is OFF) or the like are found. These phenomena are called as hot carrier effect, and it is known that these phenomena are caused by hot carrier that is generated due to high electric field in the area adjacent to the drain.

On the other hand, in MOS transistor of 1.5 μm in design rule, as a technique for buffering the OFF-current and the high electric field adjacent to the drain, an LDD (abbreviation of Lightly-Doped-Drain) structure is adopted. The LDD structure of NMOS transistor is formed by providing an n-type low-density impurity area (n−area) to the edge area of the drain using the side wall of the gate to provide a taper to the density of the impurity of the drain junction, and thereby, the concentration of electric field in the area adjacent to the drain is buffered. However, compared to the single drain structure, in the LDD structure, although the drain withstand voltage is considerably increased, since the resistance of the n−area is large, such disadvantage that drain current is decreased remains. Further, high electric field area exists under the side wall, the collision electrolytic dissociation reaches the maximum there, and hot electron is injected into the side wall. As a result, such problems of deterioration mode peculiar to the LDD that the n−area is depleted, and further, resistance is increased have emerged. Since the above-described problems have emerged accompanying the reduction of channel length, in the NMOS-transistor of 0.5 μm or less, GOLD (abbreviation of Gate-Overlapped-LDD) structure, in which the n−area is formed being overlapped with the edge area of the gate electrode, has been developed as a structure for solving the problem, and is now promoted to put into the actual mass production.

Under such circumstances as described above, in the n-channel polycrystalline silicon TFT also, in order to buffer the high electric field in the area adjacent to the drain, it is considered to apply the GOLD structured TFT. For example, an example of the application of the GOLD structured TFT is disclosed in IEDM97 TECHNICAL DIGEST; P 523-526, 1997; Mutuko Hatano, Hajime Akimoto and Takesi Sakai. In the above-described GOLD structured TFT, the sidewall for LDD of the polycrystalline gate is formed with polycrystalline silicon, and in the active layer comprised of poly-crystalline silicon layer immediately under the sidewall for LDD, a low-density impurity area (n−area), which functions as the electric field buffer area, is formed. Further, at the outside area of the low-density impurity area (n−area), a high-density impurity area (n+area), which functions as the source area and drain area, is formed. As described above, in the GOLD structured TFT, it is characterized by that the low-density impurity area (n−area) is formed being overlapped with the edge area of the gate electrode.

In the manufacturing method of a GOLD structured TFT, as for the method of forming the high-density impurity area (n+area) and the low-density impurity area (n−area), a method in which the impurity areas are formed with resist mask only; and another method in which, using the gate electrode as the mask, the impurity areas are formed in a manner of self-matching are known. In the former method in which the impurity areas are formed using the resist mask only, since the photolithography process for forming the resist mask is required to carry out twice, the increase in photolithography processes is a large disadvantage. On the other hand, in the latter method in which, using the gate electrode as the mask, the impurity areas are formed in a manner of self-matching, such an advantage that the photolithography process is prevented from increasing is provided, and that is advantageous for mass production processing.

As described above, in the polycrystalline silicon TFT, the GOLD structured TFT is taken into consideration. And as for the processing of the gate electrode of the GOLD structured TFT, the photolithography process using a positive type resist of diazonaphthoquinone (DNQ)-novolac resin series, which is generally used in semiconductor processing, and the etching process by means of dry etching are taken into consideration.

In the photolithography process using a positive type resist of diazonaphthoquinone (DNQ)-novolac resin series, as the preventive measures against halation phenomenon, conventionally, a method in which a photo-absorbent composed of dye is added to the resist material is known. The halation phenomenon is a phenomenon, in which the resist in unexposed area is locally exposed undesirably by the reflected light from the tapered shoulder portion of the high reflective base substrate resulting in a local thinness of the resist pattern. When adding the photo-absorbent to the resist material to prevent the halation phenomenon, if the added amount of the photo-absorbent is too small, the preventive effect against the halation phenomenon cannot be obtained satisfactorily. On the other hand, if the added amount of the photo-absorbent is too large, although the preventive effect against the halation phenomenon can be obtained satisfactorily, the absorbance of the resist material becomes too large resulting in such disadvantage that the taper angle of the side wall of the resist pattern decreases. Accordingly, when the photo-absorbent is added to the resist material as the preventive measures against the halation phenomenon, it is necessary to control the density of the photo-absorbent to an adequate level.

Referring to FIG. 5-F and FIG. 6-F showing an example of a GOLD structured TFT respectively, the GOLD structured TFT is constituted of a gate electrode which is comprised of a first layer gate electrode and a second layer gate electrode on the above-described first layer gate electrode. Compared to the second layer gate electrode, the first layer gate electrode is characterized in that it is formed thinner in film thickness and longer in dimension of the channel direction. The GOLD structured TFT is formed by laminating gate insulating film 203e, 303e respectively, being interposed by a semiconductor layer comprised of a polycrystalline silicon film on an insulative substrate such as a glass substrate or the like, and a first layer gate electrode 204e, 304e, which is thinner in film thickness and longer in dimension of the channel direction and a second layer gate electrode 205e, 305e, which is thicker in film thickness and shorter in dimension of the channel direction, are laminated thereon. And in the semiconductor layer, which is covered by the first layer gate electrode 204e, 304e, where is thin in film thickness and long in dimension in the channel direction, i.e., in the semiconductor layer corresponding to the area where the first layer gate electrode 204e, 301e is exposed from the second layer gate electrode 205e, 305e, an n-type low-density impurity area (n−area), which functions as the electric field buffer area, is formed so as to overlap with the gate electrode; and is named as Lov area 208, 309 respectively in FIGS. 5-F and 6-F. In the outside area of the Lov areas 208, 309, in the same manner as the above, an n-type low-density impurity area (n−area), which functions as the electric field buffer area, is formed so as not to overlap with the gate electrode; and is named as Loff areas 209, 310 respectively in FIGS. 5-F and 6-F. Furthermore, in the outside area of the Loff area 209, 310, an n-type high-density impurity area (n+area) 207, 307, which functions as the source area and drain area, is formed respectively (refer to FIGS. 5-F, 6-F).

In the GOLD structured TFT of n-type channel structured as described above, in order to increase the reliability of the GOLD structured TFT, it is preferred that the Lov area 208, 309, which overlaps with first layer gate electrode 204e, 304e, is longer. However, on the other hand, when the Lov area 208, 309 is too long, such disadvantage that the parasitic capacity increases remains. Accordingly, it is required to control the Lov area 208, 309 to an adequate dimension. The dimension of the Lov area 208, 309 is equal to that of the area where is covered by the first layer gate electrode 204e, 304e, i.e., the area where the first layer gate electrode 204e, 304e is exposed out of the second layer gate electrode 205e, 305e. Furthermore, the dimension of the Lov area 208, 309 is determined depending on the retreat amount of the resist pattern 206a, 306a in taper etching by means of resist-retreating method. Accordingly, to control the dimension of the Lov area 208, 309, it is necessary to control the retreat amount of the resist pattern 206a, 306a in taper etching, and it is known that the retreat amount of the resist is controlled by the taper angle of the side wall and the dry etching conditions of the resist pattern 206a, 306a, which is used as the mask in dry etching (refer to FIGS. 5-F, 6-F).

However, in the conventional configuration of the resist pattern 206a, 306a, the taper angle of the side wall of the resist pattern is larger than the desired taper angle in the range of 90° or less. Accordingly, it is difficult to obtain a desired retreat amount of the resist unless the loss in quantity of the resist film is increased by setting the dry etching conditions to a severer level. Also, as a result, it is difficult to form the Lov area 208, 309 of desired dimension. On the other hand, when the dry etching conditions are set to a severer level, it is foreseeable that it works adversely with respect to the break of the gate insulating film in the GOLD structured TFT from the viewpoint of the processing margin. As described above, in the conventional technique, such problem remains that it is difficult to form the Lov area 208, 309 to a desired dimension from the viewpoint of the processing margin (refer to FIGS. 5-F, 6-F).

An object of the invention is to solve the above-described problems of the conventional technique, more particularly, to solve the problems with respect to the processing margin in forming the Lov area of a GOLD structured TFT.

SUMMARY OF THE INVENTION

[Consideration on Taper Angle of the Side Wall of the Resist Pattern]

First of all, the relationship between the dimension of the Lov area of the above-described GOLD structured TFT and the angle of the side wall of the resist pattern taper, which is used as the dry etching mask for the gate electrode, will be described. FIG. 1 is a graph of data representing correlation between the taper angle of the side wall of a resist pattern and the dimension of the Lov area of a GOLD structured TFT. Based on FIG. 1, it is understood that there is a strong correlation (correlation coefficient: r=−0.889) between the taper angle of the side wall of the resist pattern and the dimension of the Lov area. In the experiment from which the data of FIG. 1 was obtained, in order to determine the taper angle of the side wall of the resist pattern, resist patterns after being subjected to post-baking (approximately 120° C.) are subjected to a baking treatment within a temperature range of 160-200° C. in an oven bake furnace to form resist patterns having various taper angle of the sidewall. As for the resist patterns after being subjected to the baking treatment in the oven bake furnace, since the baking treatment was made at a resist softening temperature higher than the glass transition temperature of the resist material, the resist pattern was softened by heat resulted in a warp on the sidewall. Therefore, it was difficult to correctly measure the taper angle of the side wall. Accordingly, the taper angle of the side wall of the resist patterns was obtained as below; i.e., the distance between the side wall corresponding to a height of 1 μm from the bottom of the resist pattern and the edge of the resist pattern was linearly approximated, and the angle which was made by the straight line and the base substrate was defined as taper angle of the side wall, and the correlation data in FIG. 1 was obtained.

Based on FIG. 1, to control the dimension of the Lov area, it is revealed that the control of the taper angle of the side wall of the resist pattern is indispensable. In the experiment where the data of FIG. 1 was obtained, in order to change the taper angle of the side wall of the resist pattern, since the baking treatment was carried out at a resist softening temperature higher than the glass transition temperature, such disadvantage that the resist pattern flows due to heat and the side wall of the resist pattern warps remains. Accordingly, in the method by which the baking treatment is carried out at a resist softening temperature higher than the glass transition temperature, since such disadvantage that the dimensional dispersion of the Lov area becomes large remains, the method is not appropriate for mass production processing. Accordingly, it was determined to examine a method other than resist softening by means of baking treatment, by which the taper angle of the side wall of the resist pattern can be made smaller stably.

For forming the resist pattern, a resist pattern composed of a positive type resist of diazonaphthoquinone (DNQ)-novolac resin series, which is generally used in semiconductor processing, is adopted. The resist pattern is formed by means of the photolithography process, which is comprised of the following steps; i.e., "resist coating"→"pre-bake (approximately 90° C.)"→"exposure"→"post-exposure baking (approximately 120° C.)"→"exposure"→"post bake (approximately 120° C.)". The foregoing post-exposure baking is a step adopted to prevent interference pattern which appears on the side wall of the exposed resist pattern when the exposure is carried out using a single wavelength (for example, g-ray or i-ray of an extra-high-voltage mercury-vapor lamp; equivalent to a compaction project exposure apparatus). Accordingly, when the exposure is carried out using, not a single wavelength exposure but a plurality of exposure wavelengths (for example, g-ray, h-ray and i-ray of an extra-high voltage mercury-vapor lamp; equivalent to an ordinary 100% magnification exposure apparatus), since the above-described interference pattern does not occur, there may be a case that the step is not adopted.

As described above, although the dimension of the Lov area depends on the taper angle of the side wall of the resist pattern, however, in actual fact, in addition to the taper angle of the side wall of the resist pattern, the dimension thereof depends also on the dry etching conditions. As the dry etching conditions, taper etching by means of resist-retreating technique, in which dry etching is carried out while the resist pattern is retreated, is adopted. In the taper etching methods, as a technique thereby the retreat amount of the resist is promoted by promoting retreat of the resist pattern, the techniques, in which oxygen ($O_2$) is added to the dry etching gas or the bias power is increased, are known.

Under the circumstances as described above, in order to obtain a desired dimension of the Lov area, it is necessary to make the taper angle of the side wall of the resist pattern smaller from the view point of the processing margin. Therefore, the invention proposes, as a technique by which the taper angle of the sidewall of the resist pattern is made smaller, a technique by which the photo-absorbency of the resist film with respect to the exposure light is increased by adding a photo-absorbent, which is a kind of dye, to the resist material, which is composed of a positive type resist of diazonaphthoquinone (DNQ)-novolac resin series. As for the resist containing photo-absorbent in which the resist material is added with photo-absorbent, although it is a conventionally well-known technique as a preventive measure against the halation phenomenon, according to the invention, the photo-absorbent is added into the resist material for the purpose of making the taper angle of the side wall of the resist pattern smaller.

FIG. 2-A is a diagram of the data representing the relationship between the distance from the resist surface and the light intensity of the exposure light when the exposure light strikes thereon from the surface of the resist, in which a mode of exponentially decay of the light intensity of the exposure light with respect to the resist surface is represented. Defining the initial light intensity of the exposure light is $I_0$; the light intensity of the exposure light at a point d away from the surface of the resist film is I; and the absorbance degree of the resist per unit film thickness is $\alpha$; the decay curve of the light intensity is expressed by a relational expression: $I=I_0 \exp[-\alpha d]$, which is well known as the law of Lambert. In this relational expression, $\alpha$ is a constant peculiar to the resist material and the wavelength. When the photo-absorbent is added to the resist material, in the decay curve of the light intensity $I=I_0 \exp[-\alpha d]$, the value of $\alpha$, which represents the absorbance per unit film thickness, becomes larger, the light intensity of the exposure light decays sharply with respect to the distance from the resist surface.

Since the further sharp decay of the exposure light leads to a decrease of the exposure energy, which arrives at the lower layer of the resist pattern, compared to the upper layer, relatively, the dimension of the resist pattern becomes larger. As a result, it is understood that the taper angle of the side wall of the resist pattern becomes smaller. Also, since the absorbance degree $\alpha$ per unit film thickness of the photo-absorbent depends on the density, it is understood that when the density of the photo-absorbent is determined, only one value of the absorbance degree $\alpha$ is also determined. Accordingly, by controlling the density of the photo-absorbent in the positive type resist containing the photo-absorbent, since it is possible to control the absorbance degree $\alpha$ per unit film thickness, it becomes possible to control the mode of the decay of the exposure energy which reaches the lower layer of the resist film. As a result, it is understood that it becomes possible to strictly control the taper angle of the side wall of the resist pattern. FIG. 2-B shows an example of configuration of the resist pattern in the case that the absorbance degree $\alpha$ per unit film thickness of the resist is large and the case that the same is small. It shows schematically that, in the case that the absorbance degree $\alpha$ is small, the taper angle of the side wall $\theta 1$ becomes larger; and in the case that the absorbance degree $\alpha$ is large, the taper angle of the side wall $\theta 2$ becomes smaller (refer to FIG. 2).

FIG. 3 is an example of graphs representing the data of the transmittance spectrum of a positive type resist of diazonaphthoquinone (DNQ)-novolac resin series before/after exposure. FIG. 3-A shows the data of the transmittance spectrum in the case that the photo-absorbent is not added; FIG. 3-B shows the data of the transmittance spectrum in the case that the photo-absorbent is added. Referring to FIG. 3, without depending on whether or not is added, in the transmittance spectrum of the unexposed resist, a sharp decrease of the transmittance is found in the range of 300-450 nm of wavelength range. On the other hand, in the transmittance spectrum of the exposed resist, a sharp decrease of the transmittance is not found in the range of 300-450 nm of wavelength range. In this range of the wavelength, since the transmittance increases owing to the exposure, the reason why the transmittance of the unexposed resist is low in this range of wavelength is caused from the photo-absorbency of the photo-absorbent for the diazonaphthoquinone series. When the photo-absorbent is added to the resist material, which has the transmittance spectrum property as described above, in both of the unexposed resist and the exposed resist, the transmittance decreases in the range of 300-500 nm of wavelength. As for the reason why the transmittance decreases before/after the exposure in both cases thereof, it is understood that since the photo-absorbency of the photo-absorbent component does not accompany any photochemical reaction, there is little changes in the state of the photo-absorbency before/after the exposure. Accordingly, when the exposure light is irradiated to the resist film containing the photo-absorbent, the photo-absorbency of the photo-absorbent for the diazonaphthoquinone series is lost in accordance with the progress of the photochemical reaction, the novolac resin component, which is the base resin, and the photo-absorbent component are the major source of the photo-absorbency of the exposed resist film.

By adding the photo-absorbent to the resist material, it is possible to decrease the transmittance in the range of 300-500 nm of wavelength in the transmittance spectrum before/after the exposure; i.e., it is possible to make the absorbance degree $\alpha$ in the foregoing wavelength range larger. In this case, since the absorbance degree $\alpha$ in the foregoing wavelength range, precisely describing, varies depending on the wavelength, it is expected that the taper angle of the side wall of the resist pattern varies depending on the exposure wavelength of the exposure apparatus. For example, as for the exposure wavelength of the compaction project exposure apparatus, a single wavelength of g-ray (436 nm) or i-ray (365 nm) of an extra-high voltage mercury-vapor lamp is adopted. On the other hand, the exposure wavelength of the projection exposure apparatus, which is a 100% magnification exposure apparatus, a multi-wavelength comprised of g-ray (436 nm), h-ray (405 nm) and i-ray (365 nm) of the extra-high voltage mercury-vapor lamp is adopted. As described above, since the exposure wavelength varies depending on the exposure apparatus, even when a resist containing photo-absorbent of the same density of the photo-absorbent is used, it is expected that the taper angle of the side wall of the resist pattern may vary. Accordingly, it is necessary to optimize the type of the photo-absorbent and amount thereof, which is added to the resist material, depending on the type of the exposure apparatus. Further, since the taper angle of the side wall of the resist pattern is subjected to the influence of the projecting optical system of the exposure apparatus, it is understood that it is necessary to optimize the type of the photo-absorbent and amount thereof, which is added to the resist material, depending on the type of the exposure apparatus.

The photolithography technique, which uses a positive type resist containing photo-absorbent, is conventionally known as a preventive measures against the halation phenomenon. Hereafter, as a reference, referring to FIG. 4, preventive mechanism against the halation phenomenon by the positive type resist containing photo-absorbent will be described. FIG. 4 is a schematic view illustrating preventive mechanism against the halation phenomenon; FIG. 4-A is a sectional view of a portion where the halation occurs; FIG. 4-B is a plane view of a portion where the halation occurs. The sectional view of FIG. 4-A is a sectional view along the line A-A' of FIG. 4-B.

The halation phenomenon is a phenomenon, in which exposure light transmitted through a quartz substrate 101 of a photo mask or a reticle reflects on a tapered shoulder portion 103 of a high-reflective substrate, and the resist film in a portion shielded by a light shielding film mask pattern 102 disposed on the quartz substrate 101 to prevent the film from being exposed is undesirably exposed by the foregoing reflected light. Due to this halation phenomenon, the undesirably exposed portion 104 is melted during developing processing; and as a result, a resist pattern 105, from which the undesirably exposed portion 104 is lost, is formed. Also, when the resist pattern 105, from which the undesirably exposed portion 104 is lost, is observed from the top, the resist pattern 105, which has a locally thin portion due to the lose of the undesirably exposed portion 104, is formed. The locally thin portion often produced, particularly, in a portion where the reflected light from the tapered shoulder portion 103 is focused (refer to FIG. 4).

In a portion where a halation phenomenon as described above occurs, defining the distance from the resist surface 106 to the tapered shoulder portion 103 is $d_1$; the distance between the tapered shoulder portion 103 and the undesirably exposed portion 104 is $d_2$; and assuming that exposure light is reflected by 100% on the tapered shoulder portion 103; the light intensity of the reflected light, which reaches the undesirably exposed portion 104, is expressed by a relational expression: $I=I_o \exp[-\alpha(d_1+d_2)]$. Accordingly, by making the absorbance degree $\alpha$ per unit film thickness of the resist larger, or by making the distance $d_2$ between the tapered shoulder portion 103 and the undesirably exposed portion 104 larger, it is possible to reduce the light intensity of the reflected light, which reaches the undesirably exposed portion 104.

As for the technique in which the distance $d_2$ between the tapered shoulder portion 103 and the undesirably exposed portion 104 is made larger, it means that the every circuit pattern at the portion where the halation occurs requires change of design. Accordingly, it is difficult to carry out the technique from the viewpoint of workability. On the other hand, as for the technique in which the absorbance degree $\alpha$ per unit film thickness of the resist is made larger, since it is easy to carry out by adding a photo-absorbent to the resist material, it has been put into practical use as a convenient preventive measures against the halation phenomenon (refer to FIG. 4).

For the purpose of prevention of the foregoing halation phenomenon, generally, a minimum amount of photo-absorbent necessary to prevent the halation phenomenon is added. The reason of this is that, if the added amount of the photo-absorbent is too excessive, although the halation phenomenon can be reliably reduced, such a disadvantage that the taper angle of the side wall of the resist pattern becomes smaller. The object of the invention is to make the taper angle of the side wall of the resist pattern smaller, and to aggressively use the fact that the taper angle of the side wall of the resist pattern becomes smaller by adding excessive photo absorbent. Accordingly, the major aim of the invention is, by controlling the density of the photo-absorbent contained in the positive type resist such as diazonaphthoquinone (DNQ)-novolac resin series, to control the taper angle of the side wall of the resist pattern to a desired taper angle, and thereby to control the dimension of the Lov area of the GOLD structured TFT having a gate electrode of double-layered structure, of which first layer gate electrode is, compared to the second layer gate electrode, thinner in film thickness and longer in dimension of the channel direction, to a desired dimensional range.

[Manufacturing Method of Semiconductor Device]

A solving means of the above-described problems will be described hereafter from the viewpoint of the manufacturing method of semiconductor device.

The constitution of the invention is characterized in that a method of producing a semiconductor device includes the steps of:

forming a resist pattern composed of a positive type resist such as diazonaphthoquinone (DNQ)-novolac resin series, which contains a photo-absorbent for the diazonaphthoquinone (DNQ)-novolac resin series, on a coating formed on an insulating substrate; and etching the coating using the resist pattern, wherein the density of the photo-absorbent contained in the positive type resist, which contains the photo-absorbent, is controlled, the taper angle of side wall of the resist pattern is set to a predetermined taper angle and the dimension of a tapered area of an etching pattern is set to a predetermined dimension.

The constitution of the invention is characterized in that a method of producing a semiconductor device, comprising the steps of:

forming a semiconductor layer on an insulating substrate;

forming a gate insulating film on the semiconductor layer;

forming a first layer gate electrode on the gate insulating film;

forming a second layer gate electrode on the first layer gate electrode;

forming a resist pattern composed of a positive type resist such as diazonaphthoquinone (DNQ)-novolac resin series, which contains a photo-absorbent for the diazonaphthoquinone (DNQ)-novolac resin series, on the second layer gate electrode;

forming a first shaped gate electrode by subjecting the first layer gate electrode and the second layer gate electrode to dry etching using the resist pattern as a mask;

forming a first impurity area by injecting a single-conductive impurity element into the semiconductor layer using the first shaped gate electrode as a mask;

forming a second shaped gate electrode in which the first layer gate electrode is longer than the second layer gate electrode in dimension of the channel direction by subjecting the first shaped gate electrode to dry etching using the resist pattern as a mask; and forming a second impurity area positioned under the first layer gate electrode and a third impurity area sandwiched between the first impurity area and the second impurity area by injecting the impurity element into the semiconductor layer using the second shaped gate electrode as a mask, wherein the density of the photo-absorbent contained in the positive type resist, which contains the photo-absorbent, is controlled, taper angle of side wall of the resist pattern is set to a predetermined taper angle and the dimension in the channel direction of the second impurity area is set to a predetermined dimension.

The constitution of the invention is characterized in that a method of producing a semiconductor device, comprising the steps of:

forming a semiconductor layer on an insulating substrate;

forming a gate insulating film on the semiconductor layer;

forming a first layer gate electrode on the gate insulating film;

forming a second layer gate electrode on the first layer gate electrode;

forming a resist pattern composed of a positive type resist such as diazonaphthoquinone (DNQ)-novolac resin series, which contains photo-absorbent for the diazonaphthoquinone (DNQ)-novolac resin series, on the second layer gate electrode;

forming a first shaped gate electrode by subjecting the first layer gate electrode and the second layer gate electrode to dry etching using the resist pattern as a mask;

forming a first impurity area by injecting a single-conductive impurity element into the semiconductor layer using the first shaped gate electrode as a mask;

forming a second shaped gate electrode in which the first layer gate electrode is longer than the second layer gate electrode in dimension of the channel direction by subjecting the first shaped gate electrode to dry etching using the resist pattern as a mask;

forming a second impurity area positioned under the first layer gate electrode and a third impurity area sandwiched between the first impurity area and the second impurity area by injecting the impurity element into the semiconductor layer using the second shaped gate electrode as a mask; and forming a third shaped gate electrode by selectively subjecting the first layer gate electrode included by the second shaped gate electrode to etching, wherein the density of photo-absorbent contained in the positive type resist, which contains the photo-absorbent, is controlled, the taper angle of side wall of the resist pattern is set to a predetermined taper angle and the dimension of the second impurity area in the channel direction overlapped with the third shaped gate electrode is set to predetermined dimension.

The invention having the above-described constitution controls the density of the photo-absorbent that is contained in the resist pattern for forming the gate electrode composed of the positive type resist which contains a photo-absorbent for the diazonaphthoquinone (DNQ)-novolac resin series. By controlling the density of the photo-absorbent, the absorbance of the resist with respect to the exposure light is controlled so as to become larger. In other words, the transmittance of the resist with respect to the exposure light is controlled so as to become smaller. Accordingly, owing to the control of the density of the photo-absorbent, since it is possible to obtain a sharp decay of the intensity of the exposure light, it is possible to reduce the exposure energy that reaches the lower layer of the resist pattern. Owing to this, the exposure energy for the upper layer of the resist pattern can be controlled to be larger, and compared to the tipper layer, the exposure energy for the lower layer of the resist pattern can be controlled to be smaller. As a result, it is possible to make the dimension of the lower layer of the resist pattern, compared to the upper layer, relatively larger. That is to say, owing to the control of the density of the photo-absorbent, it is possible to control the taper angle of the side wall of the resist pattern so as to become smaller.

According to the constitution of the invention, the taper angle of the side wall of the resist pattern for forming a gate electrode can be controlled so as to become smaller. Owing to this, even when the loss in quantity of the resist film during dry etching is small, a desired retreat amount of the resist can be obtained relatively easily. Owing to this, it is understood that, in a taper etching of a single-layer film by means of resist-retreating method, the dimension of the tapered area can be easily controlled within a desired dimensional range so as to become larger.

According to the constitution of the invention, the taper angle of the side wall of the resist pattern for forming a gate electrode can be controlled so as to become smaller. Owing to this, even when the loss in quantity of the resist film during dry etching is small, a desired retreat amount of the resist can be obtained relatively easily. Owing to this, in the foregoing second shaped gate electrode, the dimension of the exposed first layer gate electrode in the channel direction can be set to a predetermined dimension. Accordingly, the dimension of the foregoing second impurity area in the channel direction corresponding to the exposed first layer gate electrode can be set to a predetermined dimension.

According to the constitution of the invention, the taper angle of the side wall of the resist pattern for forming a gate electrode can be controlled so as to become smaller. Owing to this, even when the loss in quantity of the resist film during dry etching is small, a desired retreat amount of the resist can be obtained relatively easily. Owing to this, in the foregoing second shaped gate electrode, it is possible to set the dimension of the channel direction of the exposed first layer gate electrode, i.e., the dimension in the channel direction of the foregoing second impurity area to a predetermined dimension. Accordingly, it is possible to set the dimension in the channel direction of the area where the foregoing third shaped gate electrode overlaps with the foregoing second impurity area to a predetermined dimension.

BRIEF DESCRIPTION OF THE DRAWINGS

FIG. 2-B shows shapes of resist patterns;

FIG. 3-B is a schematic view showing an example of data of the transmittance spectrum of a positive type resist, which is composed of a diazonaphthoquinone (DNQ)-novolac resin series, added with photo-absorbent before/after exposure;

FIGS. 5-A to 5-F are sectional views showing the manufacturing process of a GOLD structured TFT;

FIGS. 6-A to 6-F are sectional views showing the manufacturing process of a GOLD structured TFT;

FIGS. 7-A to 7-B are sectional views showing the manufacturing process of an active matrix type liquid crystal display device;

FIGS. 8-A to 8-B are sectional views showing the manufacturing process of an active matrix type liquid crystal display device;

FIGS. 9-A to 9-B are sectional views showing the manufacturing process of an active matrix type liquid crystal display device;

FIGS. 10-A to 10-B are sectional views showing the manufacturing process of an active matrix type liquid crystal display device;

FIGS. 11-A to 11-B are sectional views showing the manufacturing process of an active matrix type liquid crystal display device;

DESCRIPTION OF THE PREFERRED EMBODIMENT

Figure 1:
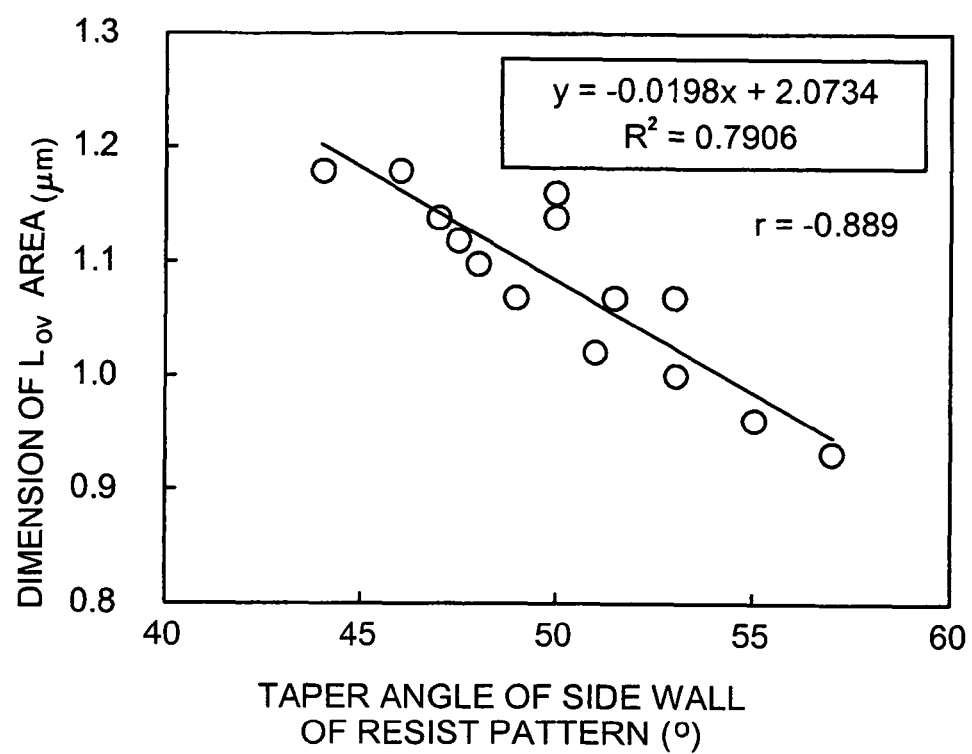
FIG. 1 is a graph of data representing correlation between taper angle of side wall of resist pattern and dimension of Lov area of GOLD structured TFT.
Figure 2A:
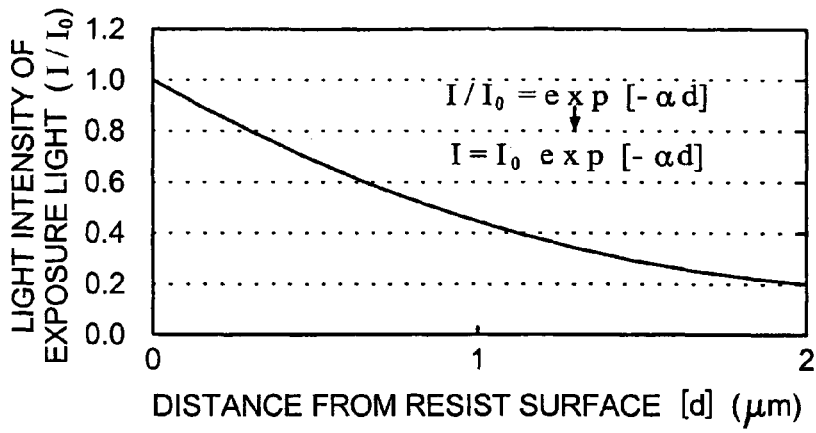
FIGS. 2-A is a schematic view showing a mode in which exposure light decays exponentially in accordance with the distance from the resist surface when the exposure light strikes upon the resist surface.
Figure 2B:
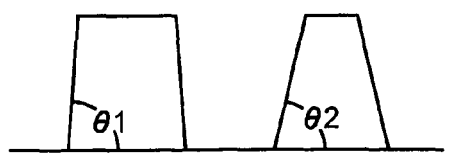
Figure 3A:
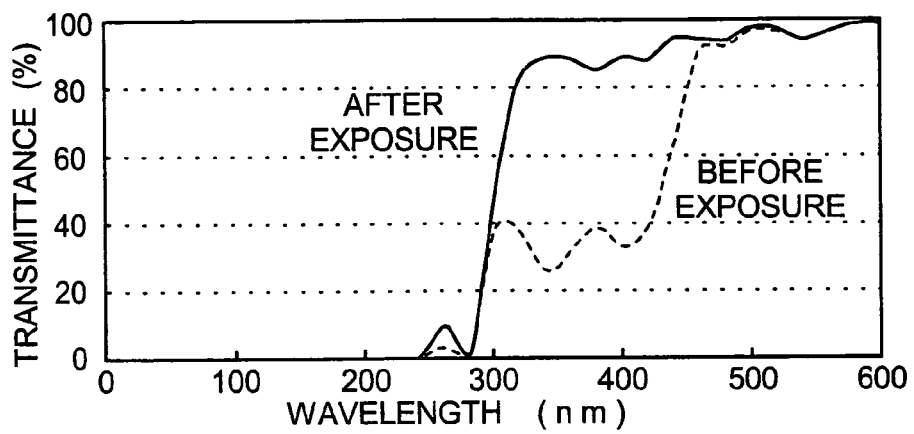
FIG. 3-A is a schematic view showing an example of data of the transmittance spectrum of a positive type resist, which is composed of a diazonaphthoquinone (DNQ)-novolac resin series, added with no photo-absorbent before/after exposure.
Figure 3B:
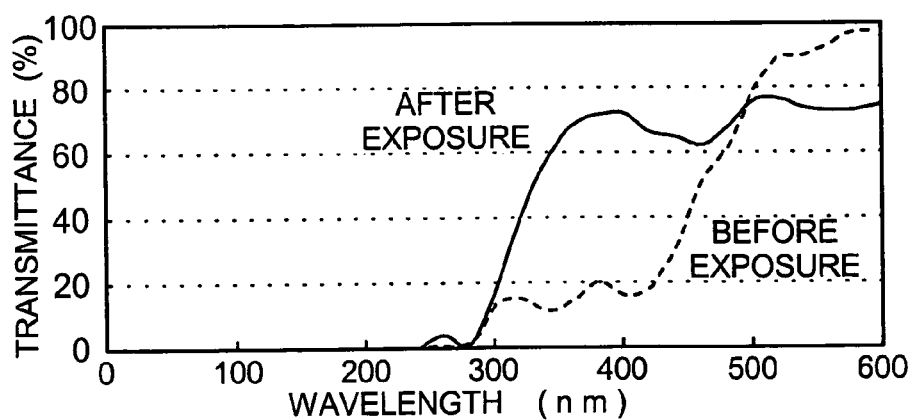
Figure 4A:
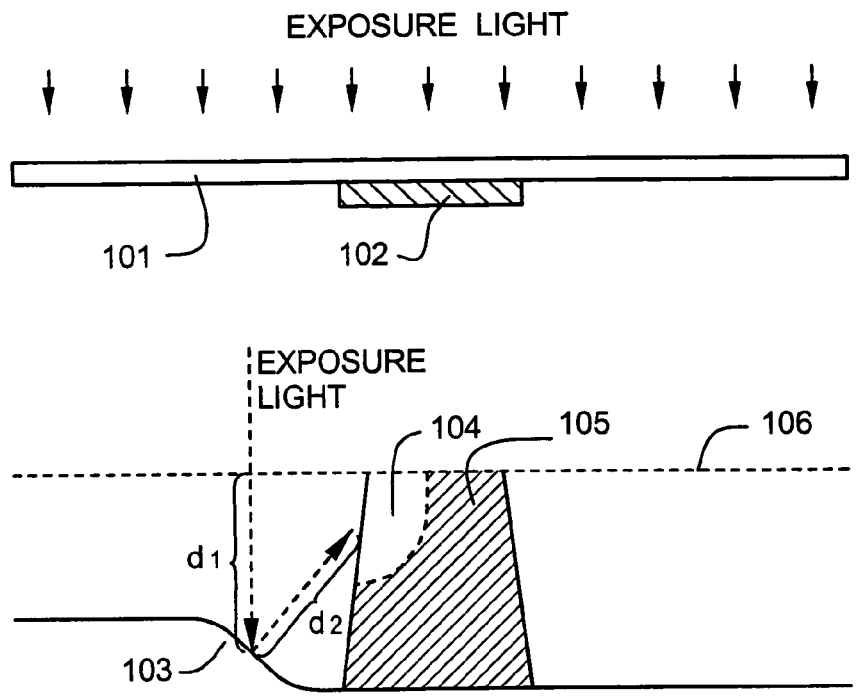
FIGS. 4-A and 4-B are schematic views illustrating the mechanism of prevention against halation phenomenon.
Figure 4B:
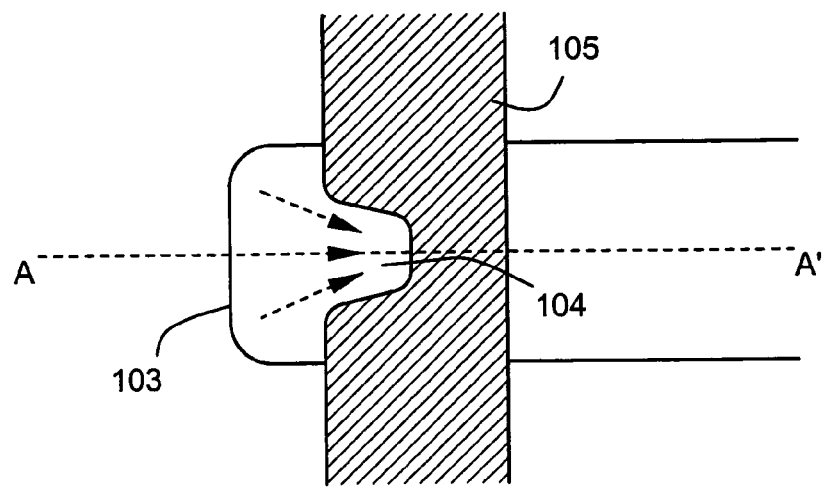
Figure 12A:
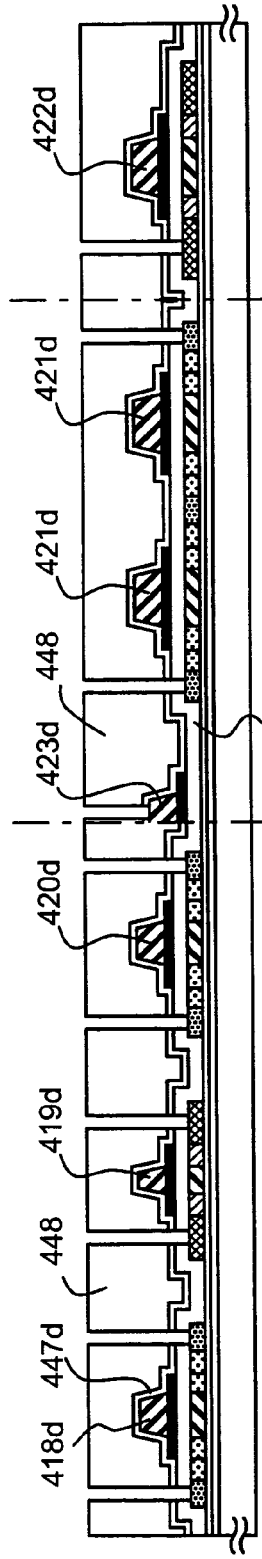
FIGS. 12-A to 12-B are sectional views showing the manufacturing process of an active matrix type liquid crystal display device.
Figure 12B:
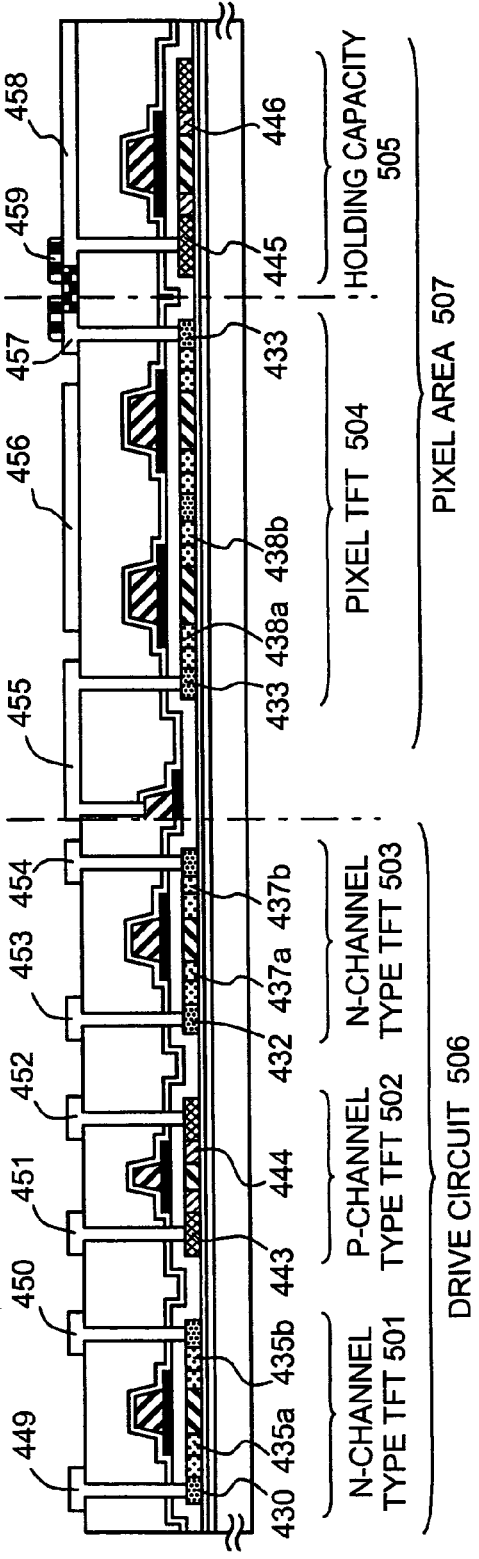

Now, referring to FIGS. 5-6, mode for carrying out the invention will be described.

Embodiment 1

In embodiment 1, a manufacturing method of a GOLD structured TFT having a gate electrode of double-layered structure, which has, compared to a second layer gate electrode, a first layer gate electrode of a thinner film thickness and a longer dimension in the channel direction, will be described with reference to FIG. 5.

First of all, a polycrystalline silicon film 202 of 50 nm in film thickness is formed on an insulative glass substrate 201 by laminating an amorphous silicon film of 53 nm in film thickness by means of a plasma CVD or a low pressure CVD and then subjecting the same to heat treatment. In this case, as the heat treatment method of the amorphous silicon film, heat treatment at 600° C., for 24 hours by means of an annealing furnace, laser crystallization by means of laser power 200 mJ/cm$^2$ or more or a combination of the heat treatment by means of an annealing furnace and the laser crystallization is available (refer to FIG. 5-A).

Next, a gate insulating film 203a composed of silicon oxide film of 100 nm in film thickness is deposited by means of plasma CVD or low pressure CVD. After that, a gate electrode film, which is comprised of a first layer gate electrode film 204a that is a TaN-film of 30 nm in film thickness and a second layer gate electrode film 205a that is a W-film of 370 nm in film thickness, is deposited by means of sputtering. In this case, it is necessary for the first layer gate electrode film 204a and the second layer gate electrode film 205a to be formed with heat-resistive materials that withstand the processing temperature in the later process. As for examples of heat-resistive materials, a metal having high melting point such as Ta (tantalum), Mo (molybdenum), Ti (titanium), W (tungsten), a metal nitride material that is a compound of a metal having a high melting point and nitrogen and a metal silicide that is a compound of a metal having a high melting point and silicon or the like are given. The first layer gate electrode film 204a and the second layer gate electrode film 205a are constituted of a different kind of metal having high melting point and a compound of a metal having a high melting point, respectively. In this mode of carrying out the invention, a combination of a TaN-film and a W-film are adopted (refer to FIG. 5-A).

Next, a resist pattern 26a of 8 μm in dimension for forming a gate electrode composed of a positive type resist such as diazonaphthoquinone (DNQ)-novolac resin series, which contains a photo-absorbent for the diazonaphthoquinone (DNQ)-novolac resin series, is formed on the second layer gate electrode film 205a by carrying out photolithography processing comprised of a combination of a positive type resist such as diazonaphthoquinone (DNQ)-novolac resin series, which contains a photo-absorbent for the diazonaphthoquinone (DNQ)-novolac resin series, and a 100% magnification exposure apparatus that performs multi-wavelength exposure (for example, g-ray, h-ray and i-ray of an extra-high voltage mercury-vapor lamp). In this case, the resist pattern 206a is controllable to a desired taper angle of the side wall so that the taper angle of the side wall of the resist pattern 206a becomes smaller by controlling the density of the photo-absorbent. In embodiment 1, the desired taper angle of the side wall is controlled in a range of 45-65°. Since the taper angle of the side wall of the resist pattern 206a strictly depends on the density of the photo-absorbent, it is understood that, when the density of the photo-absorbent is fixed, taper angle of the side wall of resist pattern 206a is also fixed. Accordingly, it is possible to form the resist pattern 206a having a stable shape. In order to control the dimension of the Lov area, which is a second impurity area formed in a later process to the range on 0.8-1.2 μm, the control range (45-65°) for the taper angle of the side wall of the resist pattern 206a is obtained by using the example (y=−0.198×+2.0734) of the recurrent line shown in FIG. 1 (refer to FIG. 5-A).

Next, a second layer gate electrode film 205b having a forwardly tapered shape is formed by subjecting the second layer gate electrode film 205a only to taper etching using the above-described resist pattern 206a as a mask (first step etching). As for dry etching apparatus, an ICP dry etching apparatus (apparatus name: E645) manufactured by Matsushita Electric Industrial Co., Ltd., which utilizes high density plasma, is used. The etching is carried out while retreating the resist pattern 206a by decreasing the selection ratio with respect to the resist pattern 206a. In this case, as for dry etching conditions, the flow rate of the mixed gas of $CF_4$, $Cl_2$ and $O_2$ is 25 sccm ($CF_4$), 25 sccm ($Cl_2$) and 10 sccm ($O_2$), respectively; ICP power is 500 W, bias power is 150 W and gas pressure is 1.0 Pa. The dry etching processing is carried out for a period of etching time in which 10% over etching is added to just etching (ordinarily, for 120 seconds or so). The resist pattern 206a, which is used as the mask of the dry etching, is changed into a shape of the resist pattern 206b owing to retreating the resist (refer to FIG. 5-B).

Next, using the second layer gate electrode film 205b as a mask, the first layer gate electrode film 204b is subjected to anisotropic etching successively to form a first layer gate electrode film 204c (second step etching). In this case, as for dry etching conditions, flow rate of the mixed gas of $CF_4$ and $Cl_2$ is 30 sccm ($CF_4$) and 30 sccm ($Cl_2$), respectively; ICP power is 500 W, bias power is 20 W, gas pressure is 1.0 Pa. The dry etching processing is carried out for a period of etching time in which over etching of 15 seconds is added to just etching (ordinarily, for 45 seconds or so) (refer to FIG. 5-C).

Owing to successive dry etching processing of the above-described first step etching and the above-described second step etching, a gate electrode having first shape comprised of the first layer gate electrode film 204c and the second layer gate electrode film 205c is formed (refer to FIG. 5-C).

Next, using an ion doping apparatus, an n-type impurity of a high dose amount is injected to form a first impurity area. The doping is carried out using P (phosphorus)-element, which is an n-type impurity, under the following doping conditions, i.e., acceleration voltage is 60-100 kV and dose amount is $1.7 \times 10^{15}$ ions/cm$^2$. Owing to this doping processing, in the polycrystalline silicon film corresponding to the outside of the gate electrode having the first shape, high-density impurity areas (n+area) 207 of n-type impurity, which are first impurity areas to function as a source area and a drain area, are formed (refer to FIG. 5-C).

Next, using the resist pattern 206c as a mask, by subjecting both of the second layer gate electrode film 205c and the first layer gate electrode film 204c to anisotropic etching, both of the gate electrode films is made to retreat to form a second layer gate electrode film 205d and a first layer gate electrode film 204d (third step etching). In this case, the dry etching processing is carried out for a period of etching time fixed to 60 seconds under the following dry etching conditions; i.e., the flow rate of the mixed gas of $CF_4$ and $Cl_2$ is 30 sccm ($CF_4$) and 30 sccm ($Cl_2$), respectively; ICP power is 500 W, bias power is 20 W and gas pressure is 1.0 Pa. In the exposed gate insulating film 203d, there are both steps, one step is formed by the foregoing second step etching, and the other step is formed by the third step etching (refer to FIG. 5-D).

Next, using the resist pattern 206d as a mask, the second layer gate electrode film 205d only is subjected selectively to anisotropic etching to form a first layer gate electrode film 204e that has the longer dimension in the channel direction and a second layer gate electrode film 205e that has the shorter dimension in the channel direction (fourth step etching). In this case, the dry etching processing is carried out for a period of etching time fixed to 20 seconds under the following dry etching conditions; i.e., the flow rate of the mixed gas of $CF_4$, $Cl_2$ and $O_2$ is 20 sccm ($CF_4$), 20 sccm ($Cl_2$) and 20 sccm ($O_2$), respectively; and ICP power is 500 W, bias power is 20 W and gas pressure is 1.0 Pa. Further, since the portion nearer to the end thereof is exposed to the etching plasma for longer time, the exposed first layer gate electrode film 204e is formed thinner toward the end thereof due to the etching (refer to FIG. 5-E).

Owing to the successive dry etching processing of the above-described third step etching and the fourth step etching, a gate electrode having second shape, in which the first layer gate electrode film 204e is longer than the second layer gate electrode film 205e in dimension of the channel direction is formed (refer to FIGS. 5-E).

Next, the remaining resist pattern 206e is removed. After that, using an ion doping apparatus, an n-type impurity of low dose amount is injected. Using P (phosphorus)-element that is an n-type impurity, the doping process is carried out under the following doping conditions; i.e., acceleration voltage is 60-100 kV and dose amount is $3 \times 10^{12}$-$3 \times 10^{13}$ ions/cm$^2$. Owing to this doping processing, in the polycrystalline silicon film corresponding to the exposed area of the first layer gate electrode film 204e out of the second layer gate electrode film 205e, low-density impurity area (n−area) 208 of n-type impurity that is a second impurity area (it is the Lov area), which functions as an electric field buffer area, is formed; and at the same time, in the polycrystalline silicon film corresponding to the outside of the first layer gate electrode film 204e, a low-density impurity area (n−area) 209 of n-type impurity that is a third impurity area (it is the Loff area), which functions as an electric field buffer area, is formed. In the resist pattern 206a composed of a positive type resist such as diazonaphthoquinone (DNQ)-novolac resin series, which contains a photo-absorbent for the diazonaphthoquinone (DNQ)-novolac resin series, by controlling the density of the photo-absorbent, the taper angle of the side wall of the resist pattern 206a is controlled within a range of 45-65°. Accordingly, the dimension of the second impurity area, which is the Lov area, is controlled within a range of 0.8-1.2 μm that is the desired dimensional range (refer to FIG. 5-F).

As described above, in the manufacturing method of a GOLD structured TFT according to the first mode of carrying out the invention, by controlling the density of the photo-absorbent, which is contained in the positive type resist containing photo-absorbent, it is possible to control the taper angle of the side wall of the resist pattern for forming the gate electrode so that the angle becomes smaller to a desired taper angle of the side wall. In the first mode to carrying out the invention, the desired taper angle of the side wall is controlled within a range of 45-65°. Accordingly, even when the loss of the resist film is small in the dry etching processing, it is possible to make the resist to retreat relatively largely.

Therefore, in the above-described second shaped gate electrode in which the first layer gate electrode is longer than the second layer gate electrode in dimension in the channel direction, it is possible to easily control the dimension within a desired dimensional range so that the dimension of the channel direction of the exposed area of the first layer gate electrode out of the second layer gate electrode becomes larger. It means that the dimension in the channel direction of the above described second impurity area (it is the Lov area), which functions as an electric field buffer area, is controllable within a desired dimensional range so that the dimension becomes larger. In embodiment 1, the dimension of the above-described second impurity area is controlled within a range of 0.8-1.2 μm. The dimensional control range 0.8-1.2 μm of the above-described second impurity area (it is the Lov area) is determined as the optimum dimensional range taking the reliability of the GOLD structured TFT into consideration.

As described above, in the manufacturing method of a GOLD structured TFT according to the embodiment 1, it is possible to control the dimension in the channel direction of the above-described second impurity area (it is the Lov area), which functions as an electric field buffer area, within a desired dimensional range so that the dimension becomes larger. It is understood that the above-described fact contributes desirably to the stabilization of the dimension in the channel direction of the above-described second impurity area (it is the Lov area). Accordingly, it is understood that the present invention is effective in improving the reliability upon the hot carrier of the GOLD structured TFT.

Embodiment 2

Referring to FIG. 6, different from the first mode of carrying out the invention, another manufacturing method of a GOLD structured TFT having a double-layered gate electrode in which, compared to a second layer gate electrode, a first layer gate electrode is thinner in film thickness and longer in dimension of the channel direction will be described.

In embodiment 2, since the manufacturing steps shown in FIG. 6-A to FIG. 6-C are the same basically as the manufacturing steps shown in FIG. 5-A to FIG. 5-C of embodiment 1, detailed description thereof will be omitted herein. These manufacturing processes will be described just schematically below. Using a resist pattern 306*a* as a mask, successive dry etching processing is carried out by means of first step etching and second step etching to form a gate electrode having a first shape comprised of a first layer gate electrode film 304*c* and a second layer gate electrode film 305*c*. Further, an n-type impurity of high dose amount is injected into the polycrystalline silicon film corresponding to the outside of the gate electrode having the first shape to form a high-density impurity areas (n+area) 307 of n-type impurity that is a first impurity areas for functioning as the source area and the drain area.

Further, same as embodiment 1, the resist pattern 306*a* is a resist pattern of 8 μm in dimension and is formed using a positive type resist such as diazonaphthoquinone (DNQ)-novolac resin series which contains a photo-absorbent for the diazonaphthoquinone (DNQ)-novolac resin series. The resist pattern 306*a* is controllable to a desired taper angle of the side wall by controlling the density of the photo-absorbent so that the taper angle of the side wall of the resist pattern 306*a* becomes smaller. Same as embodiment 1, the desired taper angle of the side wall is controlled within a range of 45-65°.

Next, using the resist pattern 306*c* as a mask, the second layer gate electrode film 305*c* only is subjected to anisotropic etching (third step etching) to form a second layer gate electrode, which is comprised of first layer gate electrode film 304*d* having a longer dimension in the channel direction and a second layer gate electrode film 305*d* having a shorter dimension in the channel direction. In this case, the dry etching is carried out for a period of etching time fixed to 70 seconds under the following dry etching conditions; i.e., the flow rate of the mixed gas of $CF_4$, $Cl_2$ and $O_2$ is 20 sccm ($CF_4$), 20 sccm ($Cl_2$) and 20 sccm ($O_2$), respectively; and ICP power is 500 W, bias power is 20 W and gas pressure is 1.0 Pa. Further, in the exposed first layer gate electrode film 304*d*, since the portion closer to the edge thereof is exposed to the etching plasma for longer period of time, the film thickness of the portion closer to the edge thereof is thinner toward the edge thereof due to the etching. Furthermore, in the exposed gate insulating film 303*d*, a large step is formed due to the second step etching and third step etching (refer to FIG. 6-D).

Next, using an ion doping apparatus, an n-type impurity of low dose amount is injected. The doping is carried out using a P (phosphorus)-element as the n-type impurity under the following doping conditions; i.e., acceleration voltage is 60-100 kV and dose amount is $3 \times 10^{12}$-$3 \times 10^{13}$ ions/cm². Owing to this doping processing, in the polycrystalline silicon film corresponding to the area of the first layer gate electrode film 304*d* exposed out of the second layer gate electrode film 305*d*, a low-density impurity area (n−area) 308 of the n-type impurity, which is a second impurity area, is formed (refer to FIG. 6-D).

Next, using the resist pattern 306*d* and the second layer gate electrode film 305*d* as the masks, the first layer gate electrode film 304*d* only is selectively subjected to etching (fourth step etching) to form a third shaped gate electrode having the first layer gate electrode film 304*e* of which length in channel direction is retreated. In this case, the dry etching processing is carried out for a period of etching time fixed to 20 seconds under the following dry etching conditions; i.e., the flow rate of the mixed gas of $CF_4$, $Cl_2$ and $O_2$ is 25 sccm ($CF_4$), 25 sccm ($Cl_2$) and 10 sccm ($O_2$), respectively; and ICP power is 500 W, bias power is 20 W, gas pressure is 1.0 Pa (refer to FIG. 6-E).

Owing to the fourth step etching, the low-density impurity area (n−area) 308 of the n-type impurity, which is the previously formed second impurity area, is divided into a Lov area 309 which overlaps with the first layer gate electrode film 304*e* and a Loff area 310 which does not overlap with the first layer gate electrode film 304*e*; and both of them have a function as the electric field buffer area. Finally, the resist pattern 306*e*, which is used as the mask for the dry etching, is removed. Further, in the resist pattern 306*a* composed of a positive type resist such as diazonaphthoquinone (DNQ)-novolac resin series, which contains a photo-absorbent for the diazonaphthoquinone (DNQ)-novolac resin series, since the taper angle of the side wall of the resist pattern 306*a* is controlled within a range of 45-65° by controlling the density of the photo-absorbent, the dimension of the Lov area that is the overlapped area of the above-described second impurity area and the first layer gate electrode film 304*e*, which is the third shape gate electrode, is controlled within the desired dimensional range of 0.8-1.2 μm (refer to FIG. 6-F).

As described above, in the manufacturing method of a GOLD structured TFT according to embodiment 2, by controlling the density of the photo-absorbent for the positive type resist containing the photo-absorbent, it is possible to control the taper angle of the side wall of the resist pattern for forming the gate electrode to a desired taper angle of the side wall so that the angle becomes smaller. In the second mode of carrying out the invention, the desired taper angle of the side wall is controlled to the range of 45-65°. Accordingly, even when the loss in quantity of the resist film is small in the dry etching process, it is possible to easily make the retreat amount of the resist larger.

Accordingly, in the above-described second shaped gate electrode in which the first layer gate electrode is longer than the second layer gate electrode in dimension of the channel direction, it is possible to control the dimension in the channel direction of the area of the first layer gate electrode, which is exposed out of the second layer gate electrode, easily to a predetermined dimensional range so that the dimension becomes larger. That is to say, the dimension in the channel direction of the above-described second impurity area is controllable within the predetermined dimensional range so that the dimension becomes larger. This means that the dimension of the Lov area, which is the overlapped area of the above-described second impurity area and the first layer gate electrode in the above-described third shaped gate electrode, is easily controllable within a desired dimensional range so that the dimension becomes larger. In the second mode of carrying out the invention, the dimension of the Lov area is controlled within the range of 0.8-1.2 μm. Further, as for the dimensional control range of 0.8-1.2 μm of the Lov area that functions as the electric field buffer area, the optimum dimensional range is determined taking the reliability of the GOLD structured TFT into consideration.

As described above, in the manufacturing method of a GOLD structured TFT according to the second mode of carrying out the invention, it is possible to easily control the dimension in the channel direction of the Lov area, which functions as the electric field buffer area, within a desired dimensional range so that the dimension becomes larger. This contributes the stabilization of the dimension in the channel direction of the Lov area. Accordingly, it is understood that it is effective to increase the reliability upon the hot carrier of the GOLD structured TFT.

Heretofore, with respect to the manufacturing method of a GOLD structured TFT according to the invention, particular descriptions as to the foregoing embodiment 1 and embodiment 2 have been made. However, the invention is not limited thereto, but it is needless to say that various modifications of the invention are possible within the spirit of the invention. For example, in the above-described embodiment 1 and embodiment 2, the manufacturing method of an n-channel type GOLD structured TFT has been described. However, the invention is applicable also to a p-channel type GOLD structured TFT. In this case, into the first to third impurity areas in embodiment 1 or embodiment 2 thereof, a B (boron)-element, which is a p-type impurity, is injected.

EXAMPLE 1

Referring to FIG. 7-FIG. 12, embodiments of a manufacturing method of an active matrix type liquid crystal display device will be described in detail. In the following embodiments, as for a semiconductor layer that is the active layer of the TFT, an example will be given, in which not ordinary polycrystalline silicon film but crystalline silicon film, which is crystallized using a catalyst element (element for promoting crystallization of silicon), is adopted.

First of all, a first layer silicon nitride oxide film 402*a* is deposited 50 nm in film thickness and a second layer silicon nitride oxide film 402*b* is deposited 100 nm in film thickness, which have different composition ratio, respectively, on a glass substrate 401 by means of the plasma CVD to form a base film 402. As for the glass substrate 401 used in this example, a quartz glass, a barium borosilicate glass or an aluminum borosilicate glass or the like is available. Then, an amorphous silicon film 403*a* is deposited 55 nm in film thickness on the above-described base film 402 (402*a* and 402*b*) by means of plasma CVD. When the deposition is carried out, a natural oxide film (not shown) is formed on the surface of the amorphous silicon film 403*a* due to an influence of oxygen contained in the air that is mixed in the treating atmosphere. In the embodiments, although the amorphous silicon film 403*a* is deposited by means of plasma CVD, it may be deposited by means of low pressure CVD (refer to FIG. 7-A).

Further, while carrying out the deposition of the amorphous silicon film 403*a*, there may be a possibility that carbon, oxygen and nitrogen contained in the air are mixed. It is known that the mixture of these impurity gases causes deterioration in the finally obtained TFT property. From the fact as described above, it is known that the mixture of the above-described impurity gases acts as an inhibition factor on crystallization. Accordingly, it is desired to eliminate the mixture of the above-described impurity gases. As for particular range of the density, it is desirable to be 5E17 atoms/cm$^3$ or less for carbon and nitrogen, and 1E18 atoms/cm$^3$ or less for oxygen (refer to FIG. 7-A).

Next, the substrate is washed with diluted hydrofluoric acid for predetermined period of time. Owing to this treatment, natural oxide film (not shown) formed on the surface of the amorphous silicon film 403*a* is removed. After being rinsed successively, the substrate is dried. After that, the substrate is subjected to treatment with ozone solution for predetermined period of time to light oxidize the amorphous silicon film 403*a*. A clean and extremely thin silicon oxide film (not shown) is formed on the amorphous silicon film 403*a* by means of the light oxidization treatment, and is dried successively. Also, the extremely thin silicon oxide film (not shown) may be formed by subjecting the substrate to a treatment with hydrogen peroxide solution. The purpose of the formation of the extremely thin silicon oxide film (not shown) is to improve the wetting property with respect to the amorphous silicon film 403*a* while adding Ni-element solution, which is the solution of catalyst element, later by means of the spin addition, and to adhere the Ni-element evenly thereto (refer to FIG. 7-A).

Next, Ni-element solution, which is the solution of catalyst element having promotion effect on crystallization, is added on the entire surface of the amorphous silicon film 403*a* (precisely speaking, not shown extremely thin silicon oxide film) by means of spin adding. In these embodiments, nickel acid salt, which is an Ni compound, is solved into pure water, and the Ni-element solution prepared to a density of 10 ppm in weight conversion is added by means of spinning so that a layer containing Ni (not shown) is adhered evenly on the entire surface of the amorphous silicon film 403*a* (precisely speaking, not shown extremely thin silicon oxide film) (refer to FIG. 7-A).

Next, in order to control the amount of hydrogen contained in the amorphous silicon film 403*a* less than 5 atom %, the substrate is subjected to a heat treatment in a nitrogen atmosphere at 450° C. for one hour to carry out dehydrate treatment of the hydrogen contained in the amorphous silicon film 403*a* (refer to FIG. 7-B).

Next, the substrate is subjected to a heat treatment in an electric furnace at 550° C. for four hours to carry out the crystallization of the amorphous silicon film 403*a* to form a crystalline silicon film 403*b*. After that, in order to increase the crystallization performance of the crystalline silicon film 403*b*, the crystalline silicon film 403*b* is subjected to a laser irradiation using a pulse generating type KrF excimer laser (wavelength: 248 nm) (refer to FIG. 7-B).

In order to distinguish the polycrystalline silicon film that is crystallized using an Ni-element, which is a catalyst element, from ordinary polycrystalline silicon film, it is called as crystalline silicon film. Herein, the reason why it is not called as "polycrystalline" but is called as "crystalline" is, compared to ordinary polycrystalline silicon film, since such characteristics that the crystal grains are oriented in substantially the same direction and has a high level of field shift or the like are found, to distinguish the crystalline silicon film from the polycrystalline silicon film.

Next, the crystalline silicon film 403*b* is subjected to a pattern forming by means of ordinary photolithography processing and dry etching processing to form semiconductor layers 404-408 which are to be formed into a channel area, a source area and a drain area of the TFT, respectively. After forming semiconductor layers 404-408, channel doping, which is an ion doping of n-type or p-type impurity (B: boron or P: phosphorus) for Vth control of the TFT, may be carried out (refer to FIG. 8-A).

Next, a gate insulating film 409 composed of a silicon nitride oxide film of 100 nm in film thickness is deposited by means of plasma CVD so as to cover the above-described semiconductor layers 404-408. Since the surface of the semiconductor layers 404-408 is covered by natural oxide film (not shown), the substrate is subjected to a diluted hydrofluoric acid treatment to remove it before carrying out the deposition of the gate insulating film 409. After that, a conductive gate electrode film having a double-layered structure is deposited on the gate insulating film 409 by means of sputtering. As the gate electrode materials having double-layered structure adopted therefor, heat-resistive materials which withstand the heat treatment temperature (approximately 550-650° C.) for gettering that serves also for activation of the later impurity elements, are desired. For example, metals having a high melting point such as Ta (tantalum), Mo (molybdenum), Ti (titanium) and W (tungsten) or the like; a combination of a metal nitride material, which is a compound of a metal having a high melting point with nitrogen; or a combination of a metal silicide, which is a compound of a metal having a high melting point with silicon are available. In the embodiments of the invention, a first layer gate electrode film 410 composed of TaN-film of 30 nm in film thickness and a second layer gate electrode film 411 composed of W-film of 370 nm in film thickness are deposited by means of sputtering (refer to FIG. 8-B).

Next, a photolithography process comprised of a combination of a positive type resist such as diazonaphthoquinone (DNQ)-novolac resin series, which contains a photo-absorbent for the diazonaphthoquinone (DNQ)-novolac resin series, and a 100% magnification exposure apparatus of multi-wavelength exposure (for example, g-ray, h-ray and i-ray of an extra-high voltage mercury-vapor lamp) is carried out to form resist patterns 412a-417a on the second layer gate electrode film 411. As for the resist patterns 412a-417a, the taper angle of the side wall of the resist patterns 412a-417a is controlled within a range of 45-65° by controlling the density of the photo-absorbent contained in the positive type resist such as Diazonaphthoquinone (DNQ)-novolac resin series. In this case, the taper angle of the side wall of the resist patterns 412a-417a strictly depends on the density of the photo-absorbent. Accordingly, when the density of the photo-absorbent is fixed, since the taper angle of the side wall of the resist patterns 412a-417a is also fixed, it is possible to form resist patterns 412a-417a having a stable shape. Further, as for the control range (45-65°) of the taper angle of the side wall of the resist patterns 412a-417a, in order to control the dimension of the Lov area, which is processed in the later process, within a range of 0.8-1.2 μm, it is calculated using the example of the recurrent line (y=−0.0198x+2.0734) in FIG. 1. In the resist patterns 412a-417a, the resist patterns 412a-415a are the resist patterns for forming gate electrodes of 8 μm in dimension of the resist; the resist pattern 416a is a resist pattern for forming an electrode for holding capacity; and the resist pattern 417a is a resist pattern for forming an electrode that functions as a source wiring (refer to FIG. 9-A).

Next, using the above-described resist patterns 412a-417a as masks, by carrying out first dry etching processing, electrodes having a first shape comprised of second layer gate electrodes 418b-421b having forwardly tapered shape, a second layer electrode for holding capacity 422b and a second layer electrode for source wiring 423b, and first layer gate electrodes 424b-421b, a first layer electrode for holding capacity 428b and a first layer electrode for source wiring 429b are formed. In this case, as for a dry etching apparatus, an ICP dry etching apparatus (apparatus name: E645) manufactured by Matsushita Electric Industrial Co., Ltd., which utilizes a high density plasma, is used, and the etching is carried out while retreating the resist patterns 412a-417a by reducing the selection ratio for the resist patterns 412a-417a. Further, the resist patterns 412a-415a used as the masks for dry etching are changed into the shape of resist patterns 412b-417b by retreating the resists (refer to FIG. 9-B).

The dry etching conditions of the first dry etching processing is comprised of a first step for etching the second layer gate electrode film 411 and a second step for etching the first layer gate electrode film 410. In the first step etching, dry etching processing is carried out for a period of etching time in which just etching (ordinarily, approximately 120 seconds) is added with 10% over etching under the following conditions; i.e., the flow rate of the mixed gas of $CF_4$, $Cl_2$ and $O_2$ is 25 sccm ($CF_4$), 25 sccm ($Cl_2$) and 10 sccm ($O_2$), respectively; and IP power is 500 W, bias power is 150 W, gas pressure is 1.0 Pa. Further, in the second step etching, dry etching processing is carried out for a period of etching time in which just etching (ordinarily, approximately 45 seconds) is added with over etching for 15 seconds under the following conditions; i.e., the flow rate of the mixed gas of $CF_4$ and $Cl_2$ is 30 sccm ($CF_4$) and 30 sccm ($Cl_2$), respectively; and ICP power is 500 W, bias power is 20 W, gas pressure is 1.0 Pa.

Next, using an ion doping apparatus, a first doping processing in which an n-type impurity of high dose amount is injected is carried out to form first impurity areas in the semiconductor layers 404-408 corresponding to outside of the electrodes of a first shape. Using a p (phosphorus)-element, which is an n-type impurity, the doping processing is carried out under the following doping conditions; i.e., acceleration voltage is 60-100 kv and dose amount is $1.7 \times 10^{15}$ ions/cm$^2$. Owing to this doping processing, high-density impurity areas (n+area) 430-433 of n-type impurity, which are first impurity areas that function as the source area and the drain area are formed in the semiconductor layers 404-407; furthermore, a high-density impurity area (n+area) 434 of n-type impurity, which functions as an electrode of one side for holding capacity is formed in the semiconductor layer 408 (refer to FIG. 9-B).

Next, using the resist patterns 412b-417b as the mask, the second layer gate electrodes 418b-421b and the second layer electrode for holding capacity 422b, which are the second layer electrodes, and the second layer electrode for source wiring 423b are selectively subjected to anisotropic etching by means of second dry etching processing to form second shaped electrodes, which are comprised of the first layer electrodes, which are thin in film thickness and has a longer dimension in the channel direction, and the second layer electrodes, which are thicker in film thickness and has a shorter dimension in the channel direction. The first layer electrodes include, particularly, first layer gate electrodes 424c-427c, the first layer electrode for holding capacity 428c and the first layer electrode for source wiring 429c; the second layer electrodes include the second layer gate electrodes 418c-421c, the second layer electrode for holding capacity 422c and the second layer electrode for source wiring 423c In this case, the dry etching processing is carried out for a period of etching time fixed to 70 seconds under the following dry etching conditions; i.e., the flow rate of the mixed gas of $CF_4$, $Cl_2$ and $O_2$ is 20 sccm ($CF_4$), 20 sccm ($Cl_2$) and 20 sccm ($O_2$) respectively; and ICP power is 500 W, bias power is 20 w and gas pressure is 1.0 Pa. The exposed areas of the first layer electrodes (the first layer gate electrodes 424c-427c, the first layer electrode for holding capacity 428c and the first layer electrode for source wiring 429c) out of the second layer electrodes (the second layer gate electrodes 418c-421c, the second layer electrode for holding capacity 422c and the second layer electrode for source wiring 423c) are, since the closer portions thereof are exposed to the etching plasma for a longer period of time, thinner in film thickness due to the etching (refer to FIG. 10-A).

Next, using an ion doping apparatus, the second doping processing is carried out, in which an n-type impurity of low dose amount is injected to form second impurity areas, which are covered by the first layer electrodes of the semiconductor layers 404-408. Using a P (phosphorus)-element, which is an n-type impurity, the doping processing is carried out under the following doping conditions; i.e., acceleration voltage is 60-100 kV and dose amount is $3 \times 10^{12}$-$3 \times 10^{13}$ ions/cm$^2$. Owing to this doping processing, low-density impurity areas (n–area) 435-439 of n-type impurity, which are the second impurity areas, are formed in the semiconductor layers 404-408 corresponding to the exposed areas of the first layer electrodes (i.e., first layer gate electrodes 424c-427c and the first layer electrode for holding capacity 428c) out of the second layer electrodes (i.e., second layer gate electrodes 418c-421c and the second layer electrode for holding capacity 422c). By controlling the density of the photo-absorbent, since the taper angle of the side wall of the resist patterns 412a-417a is controlled within a range of 45-65°, the dimension in the channel direction of the exposed areas, i.e., the dimension of the second impurity area is controlled to a predetermined dimension (refer to FIG. 10-A).

Next, using resist patterns 412c-417c and the second layer electrodes (i.e., the second layer gate electrodes 418c-421c, the second layer electrode for holding capacity 422c and the second layer electrode for source wiring 423c) as the masks, the first layer electrodes (i.e., the first layer gate electrodes 424c-427c, the first layer electrode for holding capacity 428c and the first layer electrode for source wiring 429c) only are selectively subjected to etching by means of a third dry etching processing to form third shape electrodes which have first layer electrodes (i.e., first layer gate electrodes 424d-427d, a first layer electrode for holding capacity 428d and a first layer electrode for source wiring 429d) of which the length in channel direction is retreated. The reason why the length in the channel direction of the first layer electrodes is retreated by the dry etching processing is that the exposed portions of the first layer electrodes out of the second layer electrodes closer to the edges thereof are thinner in film thickness. Furthermore, the dry etching processing is carried out for a period of etching time fixed to 20 seconds under the following dry etching conditions; i.e., the flow rate of the mixed gas of CF$_4$, Cl$_2$ and O$_2$ is 25 sccm (CF$_4$), 25 sccm and (Cl$_2$) 10 sccm (O$_2$) respectively; and ICP power is 500 W, bias power is 20 W and gas pressure is 1.0 Pa (FIG. 10-B).

The low-density impurity areas (n–areas) 435-438 of n-type impurity, which is the second impurity area previously formed by means of the third dry etching processing, are divided into Lov areas 435a-438a, which overlap with the first layer gate electrodes 424d-427d, and the Loff areas 435b-438b, which do not overlap therewith; both of them have the function as the electric field buffer areas. Since the dimension in the channel direction of the previously formed second impurity area is controlled to a predetermined dimension and a stable dimension having little dimensional dispersion is obtained as a result, the dimension of the Lov areas 435a-438a is controlled within a desired dimensional range (0.8-1.2 μm). Further, the low-density impurity area (n–area) 439 of n-type impurity formed in this step in the semiconductor layer 408 is divided into an area 439a, which overlaps with the first layer electrode for holding capacities 428d, and an area 439b, which does not overlap therewith. These areas 439a and 439b are not parts of the TFT but the areas that function as electrodes for holding capacity only of one side and since it is inconvenient to call them as "Lov area" and "Loff area", they are designated as described above. Finally, the substrate is subjected to washing with a designated peeling solution to remove the resist patterns 412c-417c which have been used as the masks for dry etching (refer to FIG. 10-B).

Next, resist patterns 440-442 having opening areas in the area of the semiconductor layer 405 corresponding to P-channel type TFT 502 and in the area of the semiconductor layer 408 corresponding to holding capacity 505 are formed by means of ordinary photolithography processing. After that, using the above-described resist patterns 440-442 as the mask and an ion doping apparatus, a third doping processing is carried out to inject a p-type impurity of high dose amount. Using the gate electrode comprised of first layer gate electrode 425d and second layer gate electrode 419d as the mask, a B (boron)-element of p-type impurity is injected into the semiconductor layer 405 corresponding to the p-channel type TFT 502 by means of the doping processing. As a result, in the area corresponding to the first layer gate electrode 425d of semiconductor layer 405, a high-density impurity area (P+area) 443 that functions as a source area and a drain area having p-type conductivity is formed. At the same timer in the area covered by the first layer gate electrode 425d only, a low-density impurity area (p–area) 444, which is an Lov area that functions as an electric field buffer area, is formed. In the high-density impurity area (p+area) 443 and the low-density impurity area (p–area) 444, although the P (phosphorus)-element, which is an n-type impurity, has been already injected, since the B (boron)-element, which is of a higher dose amount ($2.5 \times 10^{15}$ ions/cm$^2$) than the P (phosphorus)-element is injected, as a result, the areas having p-type conductivity are formed. Further, in the area formed with the holding capacity 505 also, in the semiconductor layer 408, a high-density impurity area (p+area) 445 and a low-density impurity area (p–area) 446, which have p-type conductivity, are formed in the same manner as the above (refer to FIG. 11-A).

Next, after removing the above described resist patterns 440-442, a first interlayer insulating film 447 comprised of a silicon nitride oxide film of 150 nm in film thickness is deposited by means of plasma CVD. After that, in order to activate the n-type impurity (P-element) or the p-type impurity (B-element), which are injected into the semiconductor layers 404-408, by means of heating, the substrate is subjected to a heat treatment at 600° C. for 12 hours in an electric furnace. Although this heat treatment is carried out in order to activate the n-type or p-type impurity by means of heating, it also serves for gettering Ni-element, which resides in a substantially intrinsic area that functions as the channel area and an intrinsic area that functions as the one of the electrodes for forming capacity, with the above-described impurity. Although, this heat activation processing may be carried out before depositing the first interlayer insulating film 447, in the case that the wiring material such as gate electrode or the like is poor in heat resistance, it is preferred to carry out the processing after depositing the first interlayer insulating film 447. After that, in order to terminate the dangling bonds of the semiconductor layers 404-408, a hydride treatment is carried out for one hour at 410° C. in a nitrogen atmosphere containing 3% oxygen (refer to FIG. 11-B).

Next, a second interlayer insulating film 448, which is comprised of an acrylic resin film of 1.6 μm in film thickness, is deposited on the above-described first interlayer insulating film 447. After that, contact holes are formed so as to go through the second interlayer insulating film 448, the first interlayer insulating film 447 and the gate insulating film 409, which is the lower layer film, by means of ordinary photolithography processing and dry etching processing. In this case, the contact holes are formed so as to connect the second layer electrode for source wiring 423d, which functions as the source wiring and the high-density impurity areas 430, 432-433 and 443-445 (refer to FIG. 12-A).

Next, conductive metal wirings 449-454 are formed so as to connect the high-density impurity areas 430, 432 and 443 of the drive circuit 506. Further, connection electrodes 455 and 457-458 and gate wiring 456 of a pixel area 507 are formed with the same conductive material. According to the embodiment, as for the component material for the metal wirings 449-454, connection electrodes 455 and 457-458 and gate wiring 456, a laminated film of a Ti-film of 50 nm in film thickness and an Al—Ti alloy film of 500 nm in film thickness is adopted. The connection electrode 455 is formed so as to electrically connect the impurity area 433 and the second layer electrode for source wiring 423d which functions as the source wiring. The connection electrode 457 is formed so as to electrically connect to the impurity area 433 of a pixel TFT 504; the connection electrode 458 is formed so as to electrically connect to the impurity area 445 of the holding capacity 505. Further, the gate wiring 456 is formed so as to electrically connect to a plurality of second layer gate electrodes 421d of the pixel TFT 504. Then, after depositing a transparent conductive film composed of ITO (Indium-Tin-Oxide) or the like of 80-120 nm in film thickness, a pixel electrode 459 is formed by means of photolithography processing and etching processing. The pixel electrode 459 is electrically connected to the impurity area 433, which is the source area and the drain area of the pixel TFT 504, via the connection electrode 457, and further, electrically connected to impurity area 445 of the holding capacity 505 via the connection electrode 458 (refer to FIG. 12-B).

Owing to the above-described process, a GOLD structured TFT of double-layered structure having a gate electrode, in which, compared to the second layer gate electrode, the first layer gate electrode is thinner in film thickness and longer in dimension of the channel direction, can be manufactured. In the photolithography processing for forming gate electrode, which is a manufacturing process of the GOLD structured TFT, by controlling the density of the photo-absorbent contained in a positive type resist such as diazonaphthoquinone (DNQ)-novolac resin series, the taper angle of the side wall of the resist pattern is controlled within a range of 45-65°. Owing to this arrangement, it is possible to form the second impurity areas which is comprised of the Lov area and the Loff area, with stable dimension. Accordingly, it is possible to control the dimension of the Lov area within a desired dimensional range of 0.8-1.2 μm. Consequently, it is understood that, in the manufacturing process of an active matrix type liquid crystal display device, the invention is an indispensable technique for higher reliability on the electrical property of the TFT.

EXAMPLE 2

The present invention relates to the manufacturing method of a semiconductor device such as a TFT and the like and is applicable to various active matrix liquid crystal display devices and EL display devices. Therefore, the present invention can be applied to electronic equipment in general in various fields which has an active matrix liquid crystal display device as its display medium. Specific examples of the electronic equipment are described here with reference to FIGS. 13A to 15C. The electronic equipment are a video camera, a digital camera, a projector (a rear type projector or a front type projector), a head mounted display (goggle type display), a game machine, a navigation system for vehicles, a personal computer, a portable information terminal (such as a mobile computer, a cell phone, and an electronic book), etc.

Figure 13A:
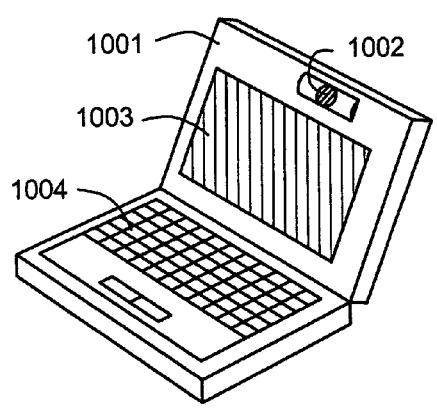
FIGS. 13-A to 13-F are schematic views showing examples of electronic apparatus incorporated with liquid crystal display device.

FIG. 13A shows a personal computer, which is composed of a main body 1001, an image input unit 1002, a display device 1003, and a keyboard 1004. The present invention is applicable to the display device 1003 and other circuits.

Figure 13B:
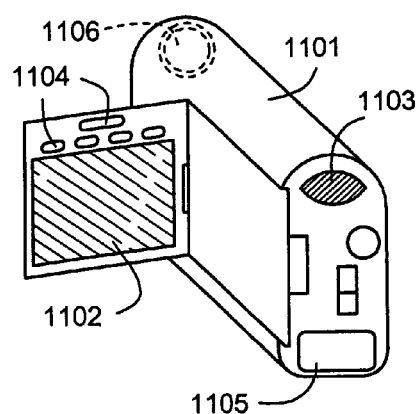

FIG. 13B shows a video camera, which is composed of a main body 1101, a display device 1102, an audio input unit 1103, operation switches 1104, a battery 1105, and an image receiving unit 1106. The present invention is applicable to the display device 1102 and other circuits.

Figure 13C:
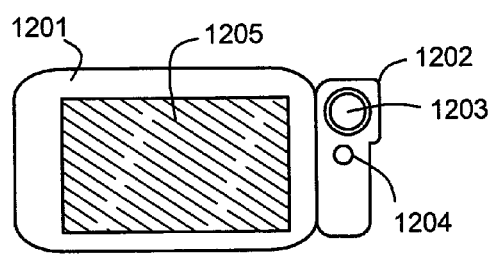

FIG. 13C shows a mobile computer, which is composed of a main body 1201, a camera unit 1202, an image receiving unit 1203, operation switches 1204, and a display device 1205. The present invention is applicable to the display device 1205 and other circuits.

Figure 13D:
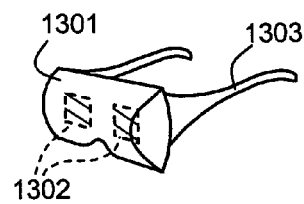

FIG. 13D shows a goggle type display, which is composed of a main body 1301, display devices 1302, and an arm unit 1303. The present invention is applicable to the display devices 1302 and other circuits.

Figure 13E:
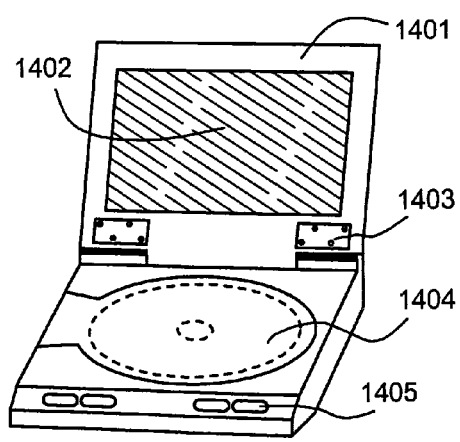

FIG. 13E shows a player using a recording medium in which a program is recorded (hereinafter abbreviated as recording medium). The player is composed of a main body 1401, a display device 1402, a speaker unit 1403, a recording medium 1404, and operation switches 1405. This device uses DVD, CD, and the like as the recording medium for listening to music, playing video games, and surfing the Internet. The present invention is applicable to the display device 1402 and other circuits.

Figure 13F:
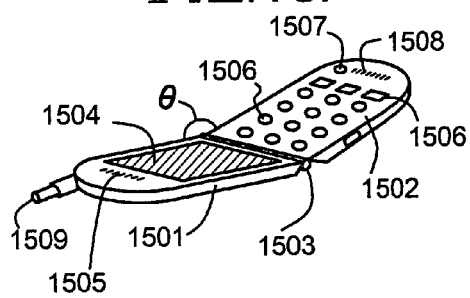

FIG. 13F shows a cell phone, which is composed of a display panel 1501, an operation panel 1502, a connecter unit 1503, a display unit 1504, an audio output unit 1505, operation keys 1506, a power switch 1507, an audio input unit 1508, and an antenna 1509. The display panel 1501 is connected to the operation panel 1502 by the connector unit 1503. An angle θ formed between the plane on which the display unit 1504 of the display panel 1501 is set and the plane on which the operation keys 1506 of the operation panel 1502 are set can be changed arbitrarily at the connector unit 1503. The present invention is applicable to the display unit 1504.

Figure 14A:
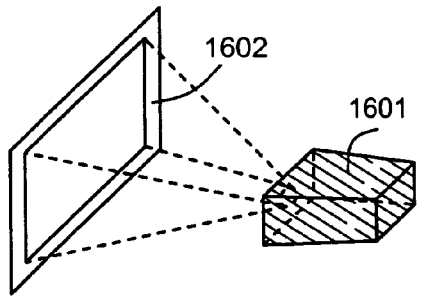
FIGS. 14-A to 14-D are schematic views showing examples of electronic apparatus incorporated with liquid crystal display device.

FIG. 14A shows a front type projector, which is composed of a light source optical system and a display device 1601 and a screen 1602. The present invention is applicable to the display device 1601 and other circuits.

Figure 14B:
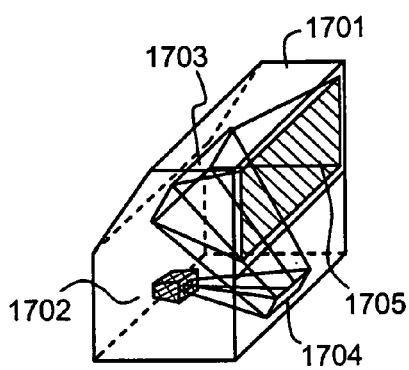

FIG. 14B shows a rear type projector, which is composed of a main body 1701, a light source optical system and display device 1702, mirrors 1703 and 1704, and a screen 1705. The present invention is applicable to the display device 1702 and other circuits.

Figure 14C:
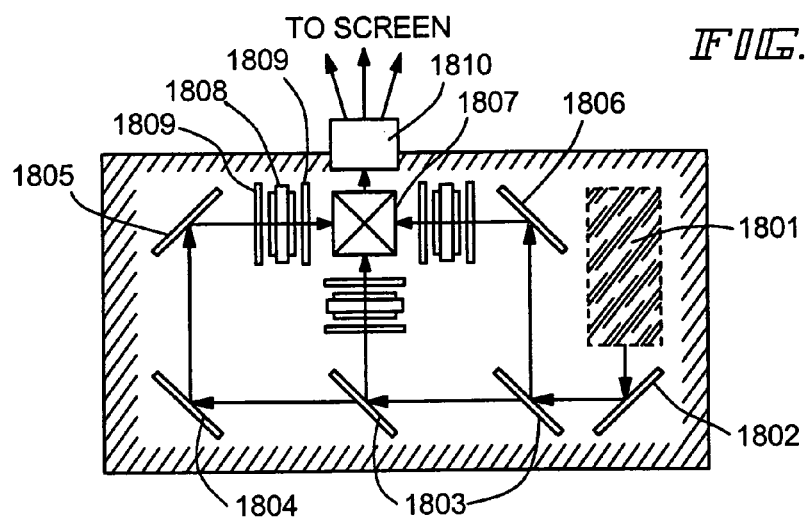

FIG. 14C is a diagram showing an example of the structure of the light source optical system and display device 1601 in FIG. 14A or the light source optical system and display device 1702 in FIG. 14B. The light source optical system and display device 1601 or 1702 is composed of a light source optical system 1801, mirrors 1802 and 1804 to 1806, dichroic mirrors 1803, an optical system 1807, display devices 1808, phase difference plates 1809, and a projection optical system 1810. The projection optical system 1810 is comprised of a plurality of optical lenses provided with a projection lens. This structure is called a three-plate type since it employs three display devices 1808. In the light path indicated by the arrow in FIG. 14C, an optical lens and a film having polarizing function, a film for adjusting the phase difference, or an IR film may be provided at discretion.

Figure 14D:
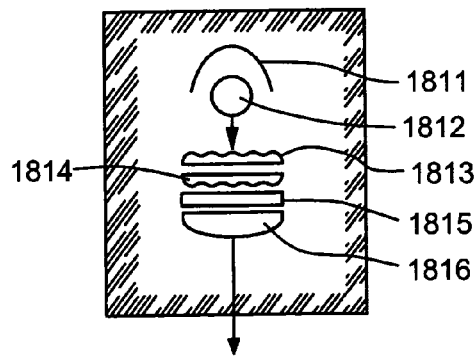

FIG. 14D is a diagram showing an example of the structure of the light source optical system 1801 in FIG. 14C. In this example, the light source optical system 1801 is composed of a reflector 1811, a light source 1812, lens arrays 1813 and 1814, a polarization converting element 1815, and a condenser 1816. The light source optical system shown FIG. 14D is merely an example and the present invention is not limited thereto. For example, the light source optical system may be provided with an optical lens and a film having polarizing function, a film for adjusting the phase difference, or an IR film at discretion.

Figure 15A:
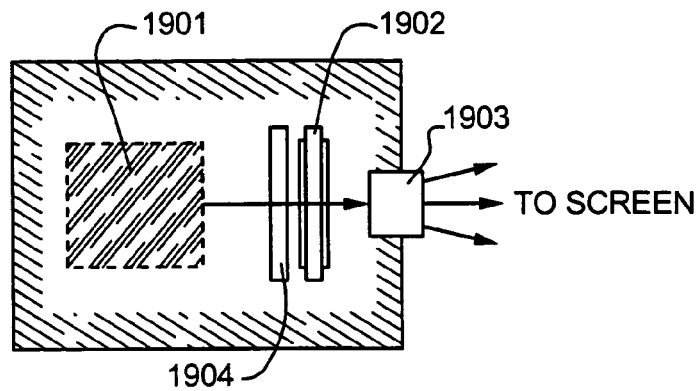
FIGS. 15-A to 15-C are schematic views showing examples of electronic apparatus incorporated with liquid crystal display device.

FIG. 15A shows an example of single plate type. A light source optical system and a display device in FIG. 15A is composed of a light source optical system 1901, a display device 1902, a projection optical system 1903, and a phase difference plate 1904. The projection optical system 1903 is comprised of a plurality of optical lenses provided with a projection lens. The light source optical system and display device of FIG. 15A can be applied to the light source optical system and display devices 1601 and 1702 of FIGS. 14A and 14B. The light source optical system shown in FIG. 14D can be used for the light source optical system 1901. The display device 1902 has color filters (not shown) to display images in color.

Figure 15B:
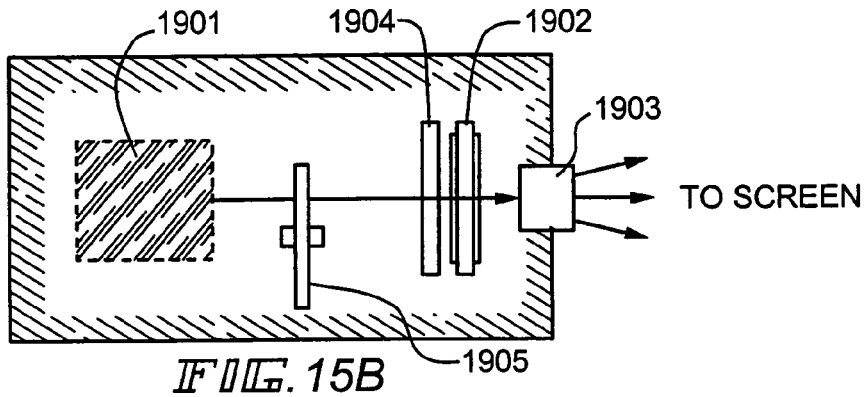

FIG. 15B shows an application example of the light source optical system and display device of FIG. 15A. In this example, a rotary RGB color filter disk 1905 is used instead of the color filters to display a color image. The light source optical system and display device of FIG. 15B can be applied to the light source optical system and display devices 1601 and 1702 of FIGS. 14A and 14B.

Figure 15C:
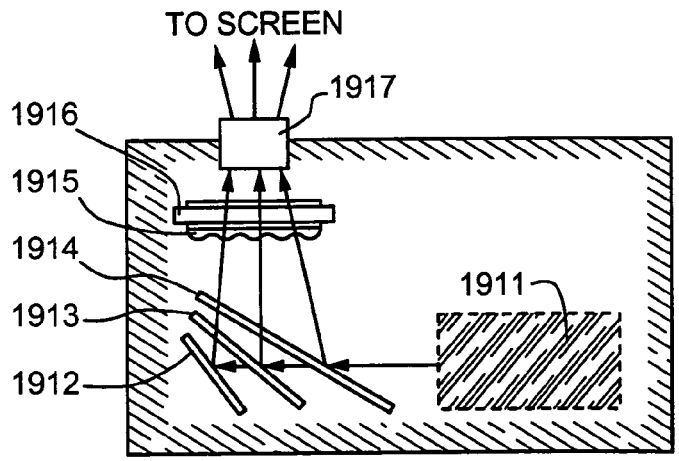

A light source optical system and display device shown in FIG. 15C is called a color filter less single plate type. This type displays a color image by providing a display device 1916 with a microlens array 1915 and using a dichroic mirror (green) 1912, a dichroic mirror (red) 1913, and a dichroic mirror (blue) 1914. A projection optical system 1917 is comprised of a plurality of optical lenses provided with a projection lens. The light source optical system and display device of FIG. 15C can be applied to the light source optical system and display devices 1601 and 1702 of FIGS. 14A and 14B. An optical system having a coupling lens and a collimator lens in addition to a light source can be used as the light source optical system 1911.

As described above, the application range of the semiconductor device of the present invention and its manufacturing method is extremely wide. The present invention is therefore applicable to electronic equipment of various fields which has an active matrix liquid crystal display device or a EL display device.

Hereinafter, effect of the invention will be described.
(Effect 1)
By controlling the density of the photo-absorbent, the taper angle of the side wall of the resist pattern composed of a positive type resist such as diazonaphthoquinone (DNQ)-novolac resin series, which contains photo-absorbent for the diazonaphthoquinone (DNQ)-novolac resin series, can be controlled to a predetermined taper angle. Owing to this, it is possible to control the retreat amount of the resist when carrying out dry etching. Further, in the double layered gate electrodes, the dimension in the channel direction in the exposed area of the gate electrode of the one side, i.e., the dimension in the channel direction of the Lov area, which is the impurity area that functions as the electric field buffer area, can be controlled to a predetermined dimension. Accordingly, since it is possible to optimize the dimension in the channel direction of the Lov area, the invention is effective from the viewpoint of the reliability on the hot carrier in the GOLD structured TFT.
(Effect 2)
It is possible to control the dimension in the channel direction of the Lov area, which functions as the electric field buffer area of the GOLD structured TFT, to a predetermined dimension. Accordingly, it is possible to reduce the dimensional dispersion in the channel direction of the Lov area. The above-described effect is effective from the viewpoint of the reliability on the hot carrier in the GOLD structured TFT.

(Effect 3)
By controlling the density of the photo-absorbent, it is possible to control the taper angle of the side wall of the resist pattern composed of a positive type resist such as diazonaphthoquinone (DNQ)-novolac resin series, which contains a photo-absorbent for the diazonaphthoquinone (DNQ)-novolac resin series, to a predetermined taper angle. Owing to this, it is not necessary to set severe dry etching conditions to obtain a desired retreat amount of the resist. Accordingly, it is possible to enlarge the etching margin for preventing the gate insulating film of the GOLD structured TFT from being broken. As a result, it is possible to reliably reduce the breaks of the gate insulating film; consequently, the invention is effective to increase the yield thereof and the reliability thereon.

What is claimed is:

1. A method of producing a semiconductor device, comprising:
    forming a semiconductor layer over an insulating substrate;
    forming a gate insulating film over said semiconductor layer;
    forming a first layer gate electrode over said gate insulating film;
    forming a second layer gate electrode over said first layer gate electrode with said first layer gate electrode thinner than said second layer gate electrode;
    forming a resist film comprising a positive type resist and a photo-absorbent over said second layer gate electrode wherein a photo-absorbency of the resist film with respect to a light is increased by adding the photo-absorbent to the positive type resist;
    patterning said resist film into a first resist pattern by irradiating a light to said resist film to form a taper angle of 45 to 65° formed between a surface of said insulating substrate and a side wall of said resist pattern;
    forming a first shaped gate electrode by subjecting said first layer gate electrode and said second layer gate electrode to a first dry etching using said first resist pattern as a mask;
    retreating said first resist pattern by said first dry etching to form a second resist pattern;
    forming a first impurity area by injecting a single-conductive impurity element into said semiconductor layer using said first shaped gate electrode as a mask;
    forming a second shaped gate electrode in which said first layer gate electrode is longer than said second layer gate electrode in dimension of the channel direction by subjecting said first shaped gate electrode to a second dry etching using said second resist pattern as a mask; and
    forming a second impurity area positioned under said first layer gate electrode by injecting said impurity element into said semiconductor layer using said second shaped gate electrode as a mask.

2. A method of producing a semiconductor device according to claim 1 wherein said first resist pattern is formed using a 100% magnification exposure apparatus of multi-wavelength exposure.

3. A method of producing a semiconductor device according to claim 2 wherein g-ray, h-ray and i-ray of an extra-high voltage mercury-vapor lamp are used for said multi-wavelength exposure.

4. A method of producing a semiconductor device according to claim 1 wherein said semiconductor device is incorporated into one selected from the group consisting of a personal computer, a video camera, a mobile computer, a goggle type display, a player using a recording medium, a cell phone, a front type projector, and a rear type projector.

5. A method of producing a semiconductor device, comprising:
- forming a semiconductor layer over an insulating substrate;
- forming a gate insulating film over said semiconductor layer;
- forming a first layer gate electrode over said gate insulating film;
- forming a second layer gate electrode over said first layer gate electrode;
- forming a resist film which contains a photo-absorbent, over said second layer gate electrode wherein said resist film comprises a positive type resist;
- patterning said resist film into a first resist pattern by irradiating a light to said resist film to form a taper angle of 45 to 65° fowled between a surface of said insulating substrate and a side wall of said first resist pattern;
- forming a first shaped gate electrode by subjecting said first layer gate electrode and said second layer gate electrode to a first dry etching using said first resist pattern as a mask;
- retreating said first resist pattern by said first dry etching to form a second resist pattern:
- forming a first impurity area by injecting a single-conductive impurity element into said semiconductor layer using said first shaped gate electrode as a mask;
- forming a second shaped gate electrode in which said first layer gate electrode is longer than said second layer gate electrode in dimension of a channel direction by subjecting said first shaped gate electrode to a second dry etching using said second resist pattern as a mask; and
- forming a second impurity area positioned under said first layer gate electrode by injecting said impurity element into said semiconductor layer using said second shaped gate electrode as a mask.

6. A method of producing a semiconductor device according to claim 5 wherein said first resist pattern is formed using a 100% magnification exposure apparatus of multi-wavelength exposure.

7. A method of producing a semiconductor device according to claim 6 wherein g-ray, h-ray and i-ray of an extra-high voltage mercury-vapor lamp are used for said multi-wavelength exposure.

8. A method of producing a semiconductor device according to claim 5 wherein said semiconductor device is incorporated into one selected from the group consisting of a personal computer, a video camera, a mobile computer, a goggle type display, a player using a recording medium, a cell phone, a front type projector, and a rear type projector.

9. A method of producing a semiconductor device according to claim 5, wherein said first layer gate electrode and said second layer gate electrode comprise different metals or compounds which include metals respectively.

10. A method of producing a semiconductor device according to claim 5, wherein said semiconductor layer is a polycrystalline silicon film or a crystalline silicon film formed using an element for promoting crystallization of silicon.

11. method of producing a semiconductor device according to claim 5, wherein said impurity element is an element that gives n-type or p-type to the area.

12. A method of producing a semiconductor device, comprising:
- forming a semiconductor layer over an insulating substrate;
- forming a gate insulating film over said semiconductor layer;
- forming a first layer gate electrode over said gate insulating film;
- forming a second layer gate electrode over said first layer gate electrode;
- forming a resist film which contains a photo-absorbent, over said second layer gate electrode wherein said resist film comprises a positive type resist;
- patterning said resist film into a first resist pattern by irradiating a light to said resist film to form a taper angle of 45 to 65° formed between a surface of said insulating substrate and a side wall of said first resist pattern;
- forming a first shaped gate electrode by subjecting said first layer gate electrode and said second layer gate electrode to a first dry etching using said first resist pattern as a mask;
- retreating said first resist pattern by said first dry etching to form a second resist pattern;
- forming a first impurity area by injecting a single-conductive impurity element into said semiconductor layer using said first shaped gate electrode as a mask;
- forming a second shaped gate electrode in which said first layer gate electrode is longer than said second layer gate electrode in dimension of a channel direction by subjecting said first shaped gate electrode to a second dry etching using said second resist pattern as a mask;
- forming a second impurity area positioned under said first layer gate electrode by injecting said impurity element into said semiconductor layer using said second shaped gate electrode as a mask; and
- forming a third shaped gate electrode by selectively subjecting said first layer gate electrode obtained by said second dry etching to a third etching.

13. A method of producing a semiconductor device according to claim 12, wherein said first resist pattern is formed using a 100% magnification exposure apparatus of multi-wavelength exposure.

14. A method of producing a semiconductor device according to claim 13 wherein g-ray, h-ray and i-ray of an extra-high voltage mercury-vapor lamp are used for said multi-wavelength exposure.

15. A method of producing a semiconductor device according to claim 12 wherein said semiconductor device is incorporated into one selected from the group consisting of a personal computer, a video camera, a mobile computer, a goggle type display, a player using a recording medium, a cell phone, a front type projector, and a rear type projector.

16. A method of producing a semiconductor device according to claim 12, wherein said first layer gate electrode and said second layer gate electrode comprise different metals or compounds which include metals respectively.

17. A method of producing a semiconductor device according to claim 12, wherein said semiconductor layer is a polycrystalline silicon film or a crystalline silicon film formed using an element for promoting crystallization of silicon.

18. A method of producing a semiconductor device according to claim 12, wherein said impurity element is an element that gives n-type or p-type to the area.

* * * * *

UNITED STATES PATENT AND TRADEMARK OFFICE
CERTIFICATE OF CORRECTION

PATENT NO. : 8,420,546 B2
APPLICATION NO. : 11/516273
DATED : April 16, 2013
INVENTOR(S) : Ichiro Uehara et al.

It is certified that error appears in the above-identified patent and that said Letters Patent is hereby corrected as shown below:

In the Specification:

Column 3, line 30; Change "301e is" to --304e is--.
Column 10, line 18; Change "the tipper layer, the" to --the upper layer, the--.
Column 12, line 27; Change "pattern 26a of" to --pattern 206a of--.
Column 12, line 54; Change "example (y=-0.198×+2.0734) of" to
--example (y=-0.0198×+2.0734) of--.
Column 19, line 52; Change "electrodes 424b-421b, a" to --electrodes 424b-427b, a--.
Column 20, line 5; Change "and IP power is" to --and ICP power is--.
Column 22, line 13; Change "formed. At the same timer in" to --formed. At the same time, in--.

In the Claims:

Column 27, line 16, Claim 5; Change "65° fowled between" to --65° formed between--.

Signed and Sealed this
Tenth Day of September, 2013

Teresa Stanek Rea
*Acting Director of the United States Patent and Trademark Office*